(12) United States Patent
Harada et al.

(10) Patent No.: US 9,972,625 B2
(45) Date of Patent: May 15, 2018

(54) METHOD OF MANUFACTURING SEMICONDUCTOR INTEGRATED CIRCUIT DEVICE

(71) Applicant: SII Semiconductor Corporation, Chiba-shi, Chiba (JP)

(72) Inventors: Hirofumi Harada, Chiba (JP); Keisuke Uemura, Chiba (JP); Hisashi Hasegawa, Chiba (JP); Shinjiro Kato, Chiba (JP); Hideo Yoshino, Chiba (JP)

(73) Assignee: SII Semiconductor Corporation (JP)

( * ) Notice: Subject to any disclaimer, the term of this patent is extended or adjusted under 35 U.S.C. 154(b) by 0 days. days.

(21) Appl. No.: 15/598,670

(22) Filed: May 18, 2017

(65) Prior Publication Data
US 2017/0256545 A1 Sep. 7, 2017

Related U.S. Application Data

(62) Division of application No. 15/050,807, filed on Feb. 23, 2016, now Pat. No. 9,698,147.

(30) Foreign Application Priority Data

Feb. 25, 2015 (JP) .................................. 2015-035501
Feb. 26, 2015 (JP) .................................. 2015-037330
Sep. 30, 2015 (JP) .................................. 2015-194572

(51) Int. Cl.
| | | |
|---|---|---|
| *H01L 27/092* | (2006.01) | |
| *H01L 27/02* | (2006.01) | |
| *H01L 21/02* | (2006.01) | |
| *H01L 21/8238* | (2006.01) | |
| *H01L 29/66* | (2006.01) | |
| *H01L 29/08* | (2006.01) | |
| *H01L 29/78* | (2006.01) | |
| *H01L 29/06* | (2006.01) | |

(52) U.S. Cl.
CPC ...... *H01L 27/0922* (2013.01); *H01L 21/0217* (2013.01); *H01L 21/02164* (2013.01);
(Continued)

(58) Field of Classification Search
CPC ......... H01L 21/823857; H01L 27/0922; H01L 21/823814; H01L 21/823892;
(Continued)

(56) References Cited

U.S. PATENT DOCUMENTS 5,497,021 A     3/1996  Tada ............................ 257/369
6,137,144 A *  10/2000  Tsao .................... H01L 27/0262
                                                              257/357
(Continued)

FOREIGN PATENT DOCUMENTS

JP     2005159003    6/2005
KR     2013 72159    7/2013

OTHER PUBLICATIONS

Abstract, Publication No. JP 2008-010443, Publication Date Jan. 17, 2008.

*Primary Examiner* — Bac Au
(74) *Attorney, Agent, or Firm* — Bruce L. Adams

(57) ABSTRACT

Provided is a semiconductor integrated circuit device including a first N-channel type high withstanding-voltage MOS transistor and a second N-channel type high withstanding-voltage MOS transistor formed on an N-type semiconductor substrate, the first N-channel type high withstanding-voltage transistor including a third N-type low-concentration impurity region containing arsenic having a depth smaller than a P-type well region in a drain region within the P-type well region, and the second N-channel type high withstanding-voltage MOS transistor including a fourth N-type low-concentration impurity region that is adjacent to the P-type well region and has a bottom surface being in contact with the N-type semiconductor substrate. In this manner, the high withstanding-voltage NMOS transistors capable of operating at 30 V or higher are integrated on the N-type semiconductor substrate.

3 Claims, 15 Drawing Sheets

(52) U.S. Cl.
CPC ........... *H01L 21/823807* (2013.01); *H01L 21/823814* (2013.01); *H01L 21/823828* (2013.01); *H01L 21/823892* (2013.01); *H01L 27/0266* (2013.01); *H01L 27/0928* (2013.01); *H01L 29/0847* (2013.01); *H01L 29/66659* (2013.01); *H01L 29/7835* (2013.01); *H01L 29/0653* (2013.01); *H01L 29/7833* (2013.01)

(58) Field of Classification Search
CPC ........... H01L 27/105; H01L 27/11546; H01L 29/7835; H01L 27/0928; H01L 21/823878; H01L 27/0266; H01L 29/0847; H01L 29/0878; H01L 29/1083; H01L 29/7833; H01L 21/823807; H01L 29/0653; H01L 29/6659; H01L 29/735; H01L 29/94
See application file for complete search history.

(56) References Cited

U.S. PATENT DOCUMENTS

| | | | |
|---|---|---|---|
| 6,218,895 B1* | 4/2001 | De | H01L 27/0928 257/299 |
| 6,267,479 B1 | 7/2001 | Yamada | 257/392 |
| 6,423,584 B2 | 7/2002 | Takahashi | 257/E21.682 |
| 6,593,799 B2* | 7/2003 | De | H01L 27/0928 257/E27.067 |
| 6,903,977 B2 | 6/2005 | Fujiwara | 257/E21.679 |
| 6,911,694 B2 | 6/2005 | Negoro | 257/333 |
| 7,166,893 B2 | 1/2007 | Taniguchi | 257/336 |
| 7,525,145 B2 | 4/2009 | Shukuri | 257/311 |
| 7,528,041 B2 | 5/2009 | Honma | 257/E21.258 |
| 8,319,289 B2 | 11/2012 | Shiraishi | 257/374 |
| 9,006,832 B2* | 4/2015 | Shaeffer | H01L 21/823892 257/357 |
| 2003/0127681 A1 | 7/2003 | Nishioka | 257/315 |
| 2005/0199951 A1 | 9/2005 | Shimizu | 257/335 |
| 2005/0263843 A1* | 12/2005 | Sakakibara | H01L 21/82381 257/500 |
| 2006/0001097 A1* | 1/2006 | Nomura | H01L 21/823418 257/355 |
| 2010/0032741 A1 | 2/2010 | Ueno | 257/298 |
| 2011/0042756 A1 | 2/2011 | Hikida | 257/392 |
| 2013/0127524 A1* | 5/2013 | Yamaji | H01L 21/761 327/537 |
| 2014/0306319 A1 | 10/2014 | Torii | 257/547 |
| 2016/0141358 A1* | 5/2016 | Salcedo | H01L 29/0646 257/168 |

\* cited by examiner

14A 21   5                    14      21   5

25        25   25         25    25

19              19

METHOD OF MANUFACTURING SEMICONDUCTOR INTEGRATED CIRCUIT DEVICE

BACKGROUND OF THE INVENTION

1. Field of the Invention

The present invention relates to a semiconductor integrated circuit device on an N-type semiconductor substrate in which a power supply voltage of 30 V or higher is required, and to a method of manufacturing the semiconductor integrated circuit device.

2. Description of the Related Art

An electric circuit to be used for an electric apparatus is driven by an external power supply such as a battery. When a voltage value of the external power supply fluctuates, there is a fear of causing malfunction of the electric circuit or various abnormal phenomena. Accordingly, for a stable operation, a power management IC for regulating the external power supply to output a constant voltage and monitoring a fluctuation in voltage of the power supply is generally provided between the electric circuit and the external power supply.

One of requirements for the power management IC is high-voltage input and low-voltage output. In order to satisfy the requirement, a signal processing region for high voltage and a signal processing region for low voltage are required to be formed in a semiconductor integrated circuit device. Specifically, the signal processing region for low voltage using a low withstanding-voltage element is prepared for output circuits or internal logic circuits and the signal processing region for high voltage using a high withstanding-voltage element is prepared for input circuits or some output circuits. In this case, the circuit that requires the high withstanding voltage needs to have a large area so that an element region and an element isolation region have a structure resistive to a high voltage. Accordingly, the effort of suppressing cost rise of the semiconductor integrated circuit device becomes important in which the high withstanding-voltage element and the high withstanding-voltage structure are used only for a portion as small as possible and other regions are formed resistive only to a low voltage.

FIG. 6A is a schematic sectional view in a case where a low withstanding-voltage MOS transistor and a high withstanding-voltage MOS transistor are formed in the same semiconductor integrated circuit on a P-type semiconductor substrate.

A low withstanding-voltage NMOS transistor 501 formed on a surface of a P-type semiconductor substrate 1 includes a first gate insulating film 9, a gate electrode 6 formed directly on the first gate insulating film 9, and a drain region and a source region formed on both sides of the gate electrode 6. Each of the drain region and the source region includes an N-type high-concentration impurity region 17 having a low resistance to be brought into contact with a metal and a first N-type low-concentration impurity region 18.

On the other hand, a high withstanding-voltage NMOS transistor 503 includes the gate insulating film 9, the gate electrode 6 formed directly on the gate insulating film 9, and a drain region and a source region formed on both sides of the gate electrode 6. Each of the drain region and the source region includes the N-type high-concentration impurity region 17 and a second N-type low-concentration impurity region 19. An insulating film 13 having a thickness larger than that of the gate insulating film 9 is formed on each of the second N-type low-concentration impurity regions 19. The thick insulating film 13 is effective in electric field relaxation between a gate and the drain and therefore is beneficial.

The above-mentioned drain structure is adopted in a case where a drain withstanding voltage of 30 V or higher is required. The withstanding voltage is adjusted mainly by adjusting a length and a concentration of the second N-type low-concentration impurity region 19 on the drain side.

The N-type high-concentration impurity regions 17 of the high withstanding-voltage NMOS transistor 503 are generally manufactured in the same step as that of the N-type high-concentration impurity regions 17 of the low withstanding-voltage NMOS transistor for reducing process costs, and arsenic or antimony is used for the N-type high-concentration impurity regions 17.

Further, the second N-type low-concentration impurity regions 19 are often used as a channel-stop structure of a region outside the element so as to simplify the steps. Accordingly, the insulating film 13 formed in a LOCOS process is formed on the second N-type low-concentration impurity regions 19, and a concentration of the second N-type low-concentration impurity regions 19 is set to a concentration for preventing concentration inversion due to wirings. In general, when a frequency of use of the high withstanding-voltage NMOS transistor is low in the semiconductor integrated circuit, restrictions in terms of the structure for simplification described above are imposed on the high withstanding-voltage NMOS transistor, and therefore the element is designed under the restrictions described above.

Further, for the high withstanding-voltage NMOS transistor as illustrated in FIG. 6B, a third N-type low-concentration impurity region 14 having a depth as large as several micrometers is sometimes formed on the drain side of the high withstanding-voltage NMOS transistor so as to cover the entire N-type high-concentration impurity region 17 on the drain side and a part of the second N-type low-concentration impurity region 19 on the drain side. The formation of the third N-type low-concentration impurity region 14 has the effects of complementing for a small contact portion at a boundary between the N-type high-concentration impurity region 17 and the second N-type low-concentration impurity region 19 that are adjacent to each other so as to prevent breakdown due to heat generation caused by a high voltage and a large current that are to be applied during an electrical operation of the high withstanding-voltage NMOS transistor. Further, such a breakdown phenomenon affects not only instantaneous breakdown but also long-term reliability.

In addition, the third N-type low-concentration impurity region 14 on the drain side, which is a deep diffusion region, is also effective to improve resistance to electrostatic discharge (ESD) breakdown. The reason is as follows. Heat generation and temperature rise caused by an overcurrent at an ampere level due to instantaneously intruding static electricity can be reduced with a large contact area of a PN junction formed between the N-type diffused region having a large volume and the semiconductor substrate to suppress PN-junction breakdown (see, for example, Japanese Patent Application Laid-open No. 2008-010443).

As the semiconductor substrate to be used for the semiconductor integrated circuit described above, a P-type semiconductor substrate, which includes a large impurity concentration stable region in an ingot and provides a large wafer yield, is desired in economic terms. In functional terms and in view of users' requirements, however, an N-type semiconductor substrate is used frequently.

For example, in order to obtain a configuration in which a back bias is not applied so as to keep accuracy of the NMOS transistors to be integrated internally, there is employed a method of using the N-type semiconductor substrate, separating P-type well regions for respectively forming the NMOS transistors therein from each other, and arbitrarily changing a potential of each of the P-type well regions.

Hitherto, the integration of the high withstanding-voltage NMOS transistors on the N-type semiconductor substrate has the following problems.

First, the third N-type low-concentration impurity region 14 formed in the drain region of the high withstanding-voltage NMOS transistor in FIG. 6B is formed through a high-temperature long-time thermal treatment. Accordingly, in order to surround the entire region of the high-withstanding-voltage NMOS transistor as it is with the P-type well region, a P-type well diffusion thermal treatment step of more deeply forming the P-type well region than in the other related art is required. Accordingly, the thermal treatment should be carried out twice at a high temperature of 1100° C. or higher for a long period of time in order to form the deep well regions of both the regions. Consequently, a manufacturing time period is prolonged, while a required area is increased due to the expansion of diffusion in a transverse direction, resulting in inevitable price increase.

Further, there exists a method of employing a PN junction isolation using an epitaxial growth process or dielectric isolation using an SOI substrate, to thereby increase resistance of a double diffusion structure in a longitudinal direction to a high voltage. Although the increase in the required area can be suppressed by the above-mentioned method, manufacturing costs rise significantly. Thus, the price increase is still brought about with the above-mentioned method.

Further, as another method for the deep diffusion, a million electron volt (MeV) class ion implantation can be given. However, the MeV-class ion implantation requires an expensive apparatus. For products manufactured in an inexpensive process without employing a micro-process, in particular, product cost rise due to increase in apparatus costs cannot be ignored.

On the other hand, in a case where the resistance to the ESD or the like without forming the third N-type low-concentration impurity region 14 in the drain region of the high withstanding-voltage NMOS transistor 503, a resistor for noise reduction and the like are required to be provided. In order to prevent the breakdown due to heat generation, however, a large-size resistor that may affect the required area of the semiconductor integrated circuit device is required. Thus, the cost rise is still inevitable.

SUMMARY OF THE INVENTION

In view of the problems described above, the present invention has an object to provide a semiconductor integrated circuit device that operates at a high voltage of 30 V or higher and has resistance to breakdown due to heat generation caused by ESD or the like, the semiconductor integrated circuit device being manufactured by employing a related-art ion implantation and high-temperature thermal treatment method with the use of an N-type semiconductor substrate, without increasing a manufacturing time period, and a method of manufacturing the semiconductor integrated circuit device.

In order to solve the problems described above, a semiconductor integrated circuit device according to one embodiment of the present invention has the following configuration.

That is, the semiconductor integrated circuit device includes:
an N-channel type low withstanding-voltage MOS transistor formed in a first P-type well region formed in an N-type semiconductor substrate, the N-channel type low withstanding-voltage MOS transistor including:
a first gate insulating film;
a first gate electrode made of polycrystalline silicon;
a first N-type high-concentration drain region and a first N-type high-concentration source region each including an N-type high-concentration impurity region; and
a first N-type low-concentration drain region formed between the first gate electrode and the first N-type high-concentration drain region and a first N-type low-concentration source region formed between the first gate electrode and the first N-type high-concentration source region;
a P-channel type low-withstanding voltage MOS transistor formed in an N-type well region formed in a region different from the first P-type well region so as to be in contact with the first P-type well region, the P-channel type low-withstanding voltage MOS transistor including:
a second gate insulating film;
a second gate electrode made of polycrystalline silicon;
a P-type high-concentration drain region and a P-type high-concentration source region each including a P-type high-concentration impurity region; and
a P-type low-concentration drain region formed between the second gate electrode and the P-type high-concentration drain region and a P-type low-concentration source region formed between the second gate electrode and the P-type high-concentration source region;
a first N-channel type high withstanding-voltage MOS transistor formed in a second P-type well region that is prevented from being in contact with the first P-type well region and has the same impurity concentration as an impurity concentration of the first P-type well region, the first N-channel type high withstanding-voltage MOS transistor including:
a third gate insulating film;
a third gate electrode made of polycrystalline silicon;
a third N-type high-concentration drain region and a third N-type high-concentration source region each including an N-type high-concentration impurity region;
a third N-type low-concentration drain region formed between the third gate electrode and the third N-type high-concentration drain region and a third N-type low-concentration source region formed between the third gate electrode and the third N-type high-concentration source region;
an insulating film that has a thickness larger than a thickness of the third gate insulating film, and is formed on the third N-type low-concentration drain region and the third N-type low-concentration source region; and
a N-type low-concentration impurity region formed below a region including a part of the second N-type low-concentration drain region and the third N-type high-concentration drain region so that the third N-type low-concentration impurity region has a depth smaller than a depth of the second P-type well region; and a second N-channel high withstanding-voltage MOS transistor.

Further, according to another embodiment of the present invention, there is provided a semiconductor integrated circuit device, including:

a first P-type well region formed in an N-type semiconductor substrate;

an N-channel type low withstanding-voltage MOS transistor formed in a second P-type well region having an impurity concentration higher than an impurity concentration of the first P-type well region;

a P-channel type low withstanding-voltage MOS transistor formed in an N-type well region;

a first N-channel type high withstanding-voltage MOS transistor formed in a third P-type well region not contacting with the second P-type well region and has the same impurity concentration as an impurity concentration of the second P-type well region, the first N-channel type high withstanding-voltage MOS transistor including:

a first gate insulating film;

a first gate electrode made of polycrystalline silicon;

a first N-type high-concentration drain region and a first N-type high-concentration source region each including an N-type high-concentration impurity region;

a first N-type low-concentration drain region formed between the first electrode and the first N-type high-concentration drain region and a first N-type low-concentration source region formed between the first gate electrode and the first N-type high-concentration source region;

an insulating film that has a thickness larger than a thickness of the first gate insulating film, and is formed on the first N-type low-concentration drain region and the first N-type low-concentration source region; and a first N-type low-concentration impurity region formed below a part of the first N-type low-concentration drain region and the first N-type high-concentration drain region so that the first N-type low-concentration impurity region has a depth smaller than a depth of the third P-type well region, the first P-type well region being formed below the first N-type low-concentration impurity region and between the first N-type low-concentration impurity region and the N-type semiconductor substrate; and a second N-channel type high withstanding-voltage MOS transistor formed in a fourth P-type well region that is prevented from being in contact with the second P-type well region and has the same impurity concentration as an impurity concentration of the second P-type well region, the second N-channel type high withstanding-voltage MOS transistor including:

a second gate insulating film;

a second gate electrode made of polycrystalline silicon;

a second N-type high-concentration drain region and a second N-type high-concentration source region each including an N-type high-concentration impurity region;

a second N-type low-concentration drain region formed between the second gate electrode and the second N-type high-concentration drain region and a second N-type low-concentration source region formed between the second gate electrode and the second N-type high-concentration source region;

an insulating film that has a thickness larger than a thickness of the second gate insulating film, and is formed on the second N-type low-concentration drain region and the second N-type low-concentration source region; and a second N-type low-concentration impurity region that includes a part of the second N-type low-concentration drain region and the second N-type high-concentration drain region, is formed so as to be adjacent to the fourth P-type well region, and has a bottom surface being in contact with the N-type semiconductor substrate, the second N-channel type high withstanding-voltage MOS transistor being used as an ESD protection element.

Further, a method of manufacturing the semiconductor integrated circuit device according to the above-mentioned embodiments is used as means for solving the problems.

According to the one embodiment of the present invention, there may be provided the semiconductor integrated circuit device that has high performance, which may be operated at a high voltage of 30 V or higher and have resistance to breakdown due to heat generation caused by the ESD and the like, the semiconductor integrated circuit device being manufactured by employing the related-art ion implantation and high-temperature thermal treatment method with the use of the N-type semiconductor substrate at a low cost, without increasing the manufacturing time period, and the method of manufacturing the semiconductor integrated circuit device is given.

DETAILED DESCRIPTION OF THE INVENTION

In the present invention, for integration of a high withstanding-voltage NMOS transistor on an N-type semiconductor substrate in a semiconductor integrated circuit device that requires a high input voltage and a low output voltage, there is devised a new configuration for forming a deep N-type low-concentration impurity region in a drain region of the high withstanding-voltage NMOS transistor. Further, a high-temperature thermal treatment at 1,100° C. or higher for forming the N-type low-concentration impurity region and P-type well regions is the same as that in related-art steps. In this manner, increase in manufacturing time period and increase in costs caused thereby are suppressed.

Now, embodiments of the present invention are described referring to the accompanying drawings.

First Embodiment

Figure 1:
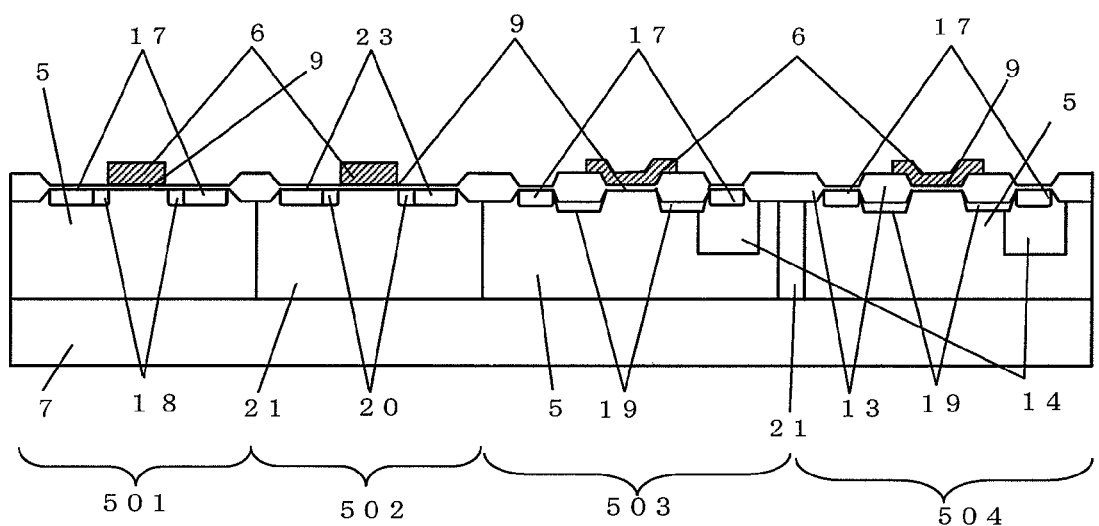
FIG. 1 is a schematic diagram for illustrating a first embodiment of the present invention.

FIG. 1 is a schematic sectional view for illustrating a first embodiment of the present invention. In this embodiment, low withstanding-voltage MOS transistors 501 and 502 for low-voltage driving and high withstanding-voltage MOS transistors 503 and 504 for high-voltage driving are integrated on an N-type semiconductor substrate 7.

The low withstanding-voltage NMOS transistor 501 is formed in a P-type well region 5 within a low-voltage signal processing region formed in a semiconductor integrated circuit device. The low withstanding-voltage NMOS transistor 501 is an NMOS transistor for low-voltage driving having the same structure as the related-art one. The low withstanding-voltage NMOS transistor 501 includes a gate electrode 6, a gate insulating film 9, N-type high-concentration impurity regions 17, and first N-type low-concentration impurity regions 18. The N-type high-concentration impurity regions 17 form a part of a drain region and a source region and are provided so as to extract a drain terminal and a source terminal. The first N-type low-concentration impurity regions 18 form a part of the drain region and the source region and are provided for electric field relaxation between the drain and the source.

Further, the low withstanding-voltage PMOS transistor 502 is formed in an N-type well region 21 within the low-voltage signal processing region also formed in the semiconductor integrated circuit device. The low withstanding-voltage PMOS transistor 502 is a PMOS transistor for low-voltage driving having the same structure as the related-art one. The low withstanding-voltage PMOS transistor 502 includes the gate electrode 6, the gate insulating film 9, P-type high-concentration impurity regions 23, and P-type low-concentration impurity regions 20. The P-type high-concentration impurity regions 23 form a part of a drain region and a source region and are provided so as to extract a drain terminal and a source terminal. The P-type low-concentration impurity regions 20 form a part of the drain region and the source region and are provided for electric field relaxation between the drain and the source.

Further, the first high withstanding-voltage NMOS transistor 503 is provided for high-voltage driving and is formed in the P-type well region 5 within a high-voltage signal processing region formed in the semiconductor integrated circuit device. The first high withstanding-voltage NMOS transistor 503 includes the gate electrode 6, the gate insulating film 9, the N-type high-concentration impurity regions 17, second N-type low-concentration impurity regions 19, a thick insulating film 13, and a third N-type low-concentration impurity region 14. The N-type high-concentration impurity regions 17 form a part of a drain region and a source region and are provided so as to extract a drain terminal and a source terminal. The second N-type low-concentration impurity regions 19 form a part of the drain region and the source region and are provided for electric field relaxation between the drain and the source. The insulating film 13 has a thickness larger than the gate insulating film and is formed on each of the second N-type low-concentration impurity regions 19 provided for electric field relaxation between the drain and the source. The third N-type low-concentration impurity region 14 is formed below a region including a part of the second N-type low-concentration impurity region 19 on the drain side and the N-type high-concentration impurity regions 17 on the drain side. The third N-type low-concentration impurity region 14 is formed to have a depth smaller than that of the P-type well region 5. The first high withstanding-voltage NMOS transistor 503 is used for a high voltage-signal processing circuit.

The second high withstanding-voltage NMOS transistor 504 is an NMOS transistor for high-voltage driving and is formed in the P-type well region 5. The second high withstanding-voltage NMOS transistor 504 is provided between a power supply terminal at high voltage and a ground terminal at the lowest potential to be used as a protection element against electrostatic noise that intrudes externally. In this embodiment, the second high withstanding-voltage NMOS transistor 504 has the same structure as that of the high withstanding-voltage NMOS transistor 503.

Although not shown, a high withstanding-voltage PMOS transistor for high-voltage driving that is formed in an N-type well region within the high-voltage signal processing region formed in the semiconductor integrated circuit device is also provided. The high withstanding-voltage PMOS transistor includes a gate electrode, a gate insulating film, P-type high-concentration impurity regions that form a part of a drain region and a source region and are provided to extract a drain terminal and a source terminal, P-type low-concentration impurity regions that form a part of the drain region and the source region and are provided for electric field relaxation between the drain and the source, and an insulating film having a thickness larger than that of the gate insulating film, and formed on the P-type low-concentration impurity regions for electric field relaxation between the gate and the drain.

Figure 2:
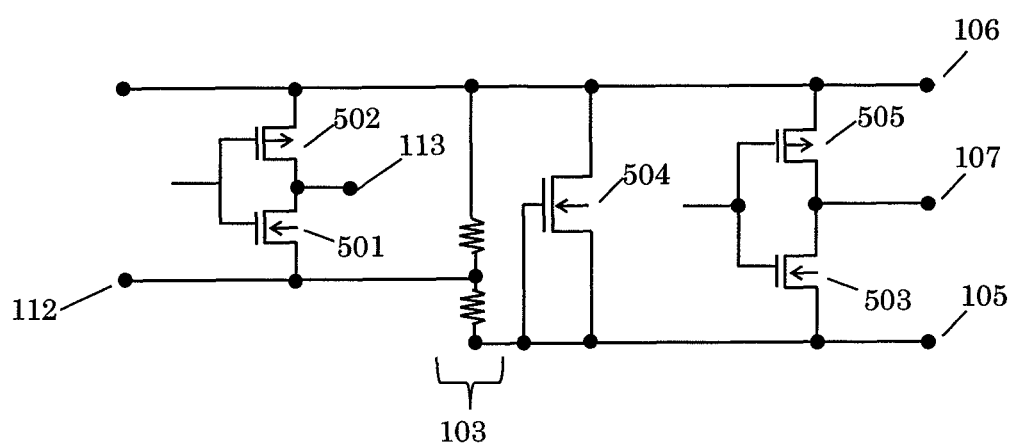
FIG. 2 is a diagram for illustrating a part of a circuit configuration to which the first embodiment of the present invention is applicable.

FIG. 2 is a partial circuit diagram for illustrating an example of representative roles of each of the MOS transistor elements described above on the circuit. As described above, a voltage to be applied between a power supply terminal 106 and a ground terminal 105 at the lowest potential has been increasing in recent years, and signal processing thereof is performed in a circuit including the first high withstanding-voltage NMOS transistor 503 and the high withstanding-voltage PMOS transistor 505.

For the protection element against electrostatic noise, for protecting an internal circuit from electrostatic noise between the power supply terminal 106 and the ground terminal 105, the second high withstanding-voltage NMOS transistor 504 having the same structure as that of the first high withstanding-voltage NMOS transistor is used in this embodiment. The second high withstanding-voltage NMOS transistor 504 employs a gate-off structure in which a drain terminal is connected to the power supply terminal 106 and a source terminal and a gate terminal are connected to the ground terminal 105. The second high withstanding-voltage NMOS transistor 504 thus has the role of releasing the electrostatic noise from the drain terminal to the ground terminal by avalanche breakdown to protect the internal circuit from the electrostatic noise only when the electrostatic noise intrudes.

If the high-voltage signal processing circuit includes an output terminal 107, the first high withstanding-voltage NMOS transistor 503 that is connected between the output terminal 107 and the ground terminal 105 in the circuit may directly serve as a protection element against electrostatic noise, for electrostatic noise generated between the output terminal 107 and the ground terminal 105. If electrostatic noise immunity is low because a small-size first high withstanding-voltage NMOS transistor is provided on the circuit, a high withstanding-voltage NMOS transistor including a channel width having a size large enough to sufficiently allow a current based on the electrostatic noise may be additionally and exclusively provided in parallel to a protection element. In this case, the high withstanding-voltage NMOS transistor is realized by a gate-off structure in which the drain terminal is connected to the output terminal 107 and the source terminal and the gate terminal are connected to the ground terminal 105.

Further, the semiconductor integrated circuit device of this embodiment has the function of generating a low voltage from a high voltage, performing signal processing at the low voltage, and then outputting the result of the signal processing at the low voltage. How the semiconductor integrated circuit device functions is schematically illustrated in FIG. 2. Specifically, after the high voltage to be applied between the power supply terminal 106 and the ground terminal 105 is stepped down through, for example, resistance division by a voltage-dividing circuit 103, the low voltage is output between the power supply terminal 106 and a low internal-voltage use ground terminal 112. Then, signal processing is performed in the low withstanding-voltage NMOS transistor 501 and the low withstanding-voltage NMOS transistor 502 that are present in the low-voltage signal processing region. The result of the signal processing is output from a low-voltage output terminal 113.

Although a protection method in a case where the electrostatic noise is externally applied between the low-voltage output terminal 113 and the low internal-voltage use ground terminal 112 or between the power supply terminal 106 and the low internal-voltage use ground terminal 112 is not illustrated, a low-voltage use protection element is additionally prepared and is connected between the terminals by a related-art method.

Next, there is described a method of realizing a high withstanding-voltage NMOS transistor with the structure according to this embodiment illustrated in FIG. 1 while using the N-type semiconductor substrate, the high withstanding-voltage NMOS transistor being capable of keeping a withstanding voltage of 30 V or higher to prevent breakdown due to heat generation caused by external electrostatic noise.

In FIG. 1, for the N-type semiconductor substrate 7, a substrate containing phosphors at a concentration of from $3\times10^{14}/cm^3$ to $8\times10^{14}/cm^3$ is selected. In order to form an electric field relaxation layer with a low impurity concentration region so as to manufacture the high withstanding-voltage NMOS transistor capable of operating at 30 V or higher, it is desired to adopt a semiconductor substrate having a low impurity concentration as low as described above.

Next, the P-type well regions 5 having the same conditions are herein used for all the NMOS transistors. The P-type well regions 5 are formed by diffusing a P-type impurity such as boron or $BF_2$ at a concentration of from $8\times10^{15}/cm^3$ to $4\times10^{16}/cm^3$ so that a diffusion depth is from 7 μm to 10 μm from a surface of the semiconductor substrate. The impurity concentration of the P-type well regions 5 is set relatively low as described above so as to enlarge the range of adjustment of the concentration of the third N-type low-concentration impurity regions 14 of the high withstanding-voltage NMOS transistors described later, thereby placing priority on the manufacture of the high withstanding-voltage NMOS transistors capable of operating at 30 V or higher.

Further, when the P-type well regions containing the impurities at the concentration described above is used for the low withstanding-voltage NMOS transistor 501, it is desired to set a minimum gate length to 1.0 μm in view of short channel effect such as reduction in withstanding voltage due to a punch-through phenomenon. In this case, the low withstanding-voltage NMOS transistor is capable of dealing with the signal processing at a voltage up to 12 V through, in particular, optimization of a structure of the first N-type low-concentration impurity region. Specifically, the first embodiment is suitable for use in a semiconductor integrated circuit device whose output voltage from the low voltage circuit is required up to 12 V, and can be manufactured in an inexpensive process for a gate length 1.0 μm or longer.

The third N-type low-concentration impurity regions 14 and a fourth N-type low-concentration impurity region 15 described later that are features of the present invention are formed by diffusing arsenic that is N-type impurities at an impurity concentration of from $2\times10^{16}/cm^3$ to $2\times10^{17}/cm^3$ so that the regions each have a depth of from 2 μm to 3.5 μm from the surface of the semiconductor substrate. The following trade-off relationship needs to be noted for setting the above-mentioned conditions. Specifically, for the third N-type low-concentration impurity regions and the fourth N-type low-concentration impurity region, when the impurity concentration is low and therefore the diffusion depth is small, the resistance to breakdown due to heat generation caused by the electrostatic noise is lowered. On the other hand, when the impurity concentration is high and therefore the diffusion depth is large, the longitudinal withstanding voltage is lowered due to the punch-through phenomenon between the third N-type low-concentration impurity regions or the fourth N-type low concentration impurity region and the N-type semiconductor substrate at the time of application of a high voltage to the third N-type low-concentration impurity regions or the fourth N-type low-concentration impurity region. Accordingly, the conditions of formation of the third N-type low-concentration impurity regions and the fourth N-type low-concentration impurity region are required to be selected in accordance with required specifications.

Figure 3:
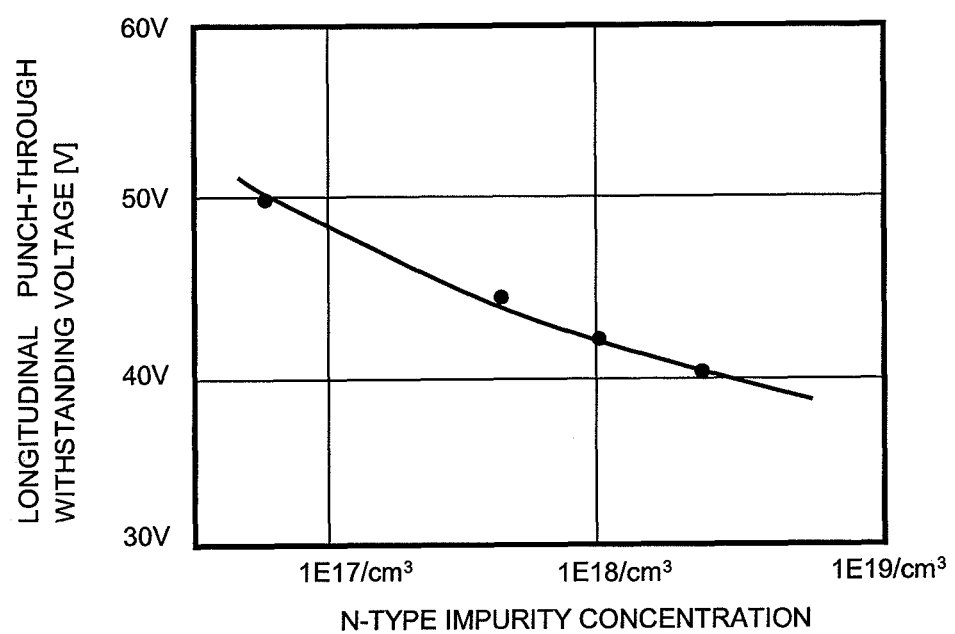
FIG. 3 is a characteristic graph for showing a relationship of a withstanding voltage in a longitudinal direction with respect to an N-type impurity concentration.

For example, for the longitudinal withstanding voltage between the third N-type low-concentration impurity regions or the fourth N-type low-concentration impurity region and the N-type semiconductor substrate, according to FIG. 3 for showing a relationship between the longitudinal withstanding voltage with respect to the impurity concentration in a case where arsenic ions are implanted as the N-type impurity for the third N-type low-concentration impurity regions or the fourth N-type low-concentration impurity region and are then diffused by a thermal treatment at 1,170° C. for about 20 hours to form the third N-type low-concentration impurity regions or the fourth N-type low-concentration impurity region, the longitudinal withstanding voltage at about 50 V can be obtained by a region having the N-type impurity concentration at $6 \times 10^{16}/cm^3$. Further, under this condition, ESD breakdown strength (human body model) at 3 kV or larger can be achieved. As a result, the semiconductor integrated circuit device that satisfies 40 V power supply voltage specifications can be realized.

In the manner described above, in the first embodiment, the withstanding voltage slightly smaller than 60 V can be realized while satisfying a criterion against breakdown due to heat generation caused by the ESD. Thus, the semiconductor integrated circuit device capable of dealing with input power supply voltage specifications from 30 V to 50 V can be provided.

Further, since arsenic is used as the N-type impurities for the fourth N-type low-concentration impurity region in this embodiment, a thermal diffusion treatment for both the P-type well regions, and the third low-concentration impurity regions and the fourth low-concentration impurity region can be realized by the single process and formation under the conditions, that is, at 1,170° C. for about 20 hours. The single processing cannot be realized if phosphorus having a large diffusion coefficient or antimony having a small diffusion coefficient is employed as the N-type impurities for the third N-type low-concentration impurity regions and the fourth N-type low-concentration impurity region. Through selection of the conditions of the present invention, the semiconductor integrated circuit device resistant to the high voltage can be manufactured based on the related-art high-temperature thermal treatment conditions using the N-type semiconductor substrate, without increasing the manufacturing time period.

On the other hand, conditions other than for the third N-type low-concentration impurity regions and the fourth N-type low-concentration impurity region are that the second N-type low-concentration impurity regions 19 are formed by using, as the impurities, phosphorous at the impurity dosage from $1 \times 10^{17}/cm^2$ to $1 \times 10^{18}/cm^2$ in order to ensure the withstanding voltage between the drain and the source of the high withstanding-voltage NMOS transistor. Further, the insulating film 13 having a thickness larger than that of the gate insulating film is formed on each of the second N-type low-concentration impurity regions 19. The thick insulating film 13 is effective in the electric field relaxation between the gate and the drain and may also be used as an LOCOS insulating film for element isolation. For the structures described above, the same conditions as those in the related art may be adopted.

Second Embodiment

Figure 4:
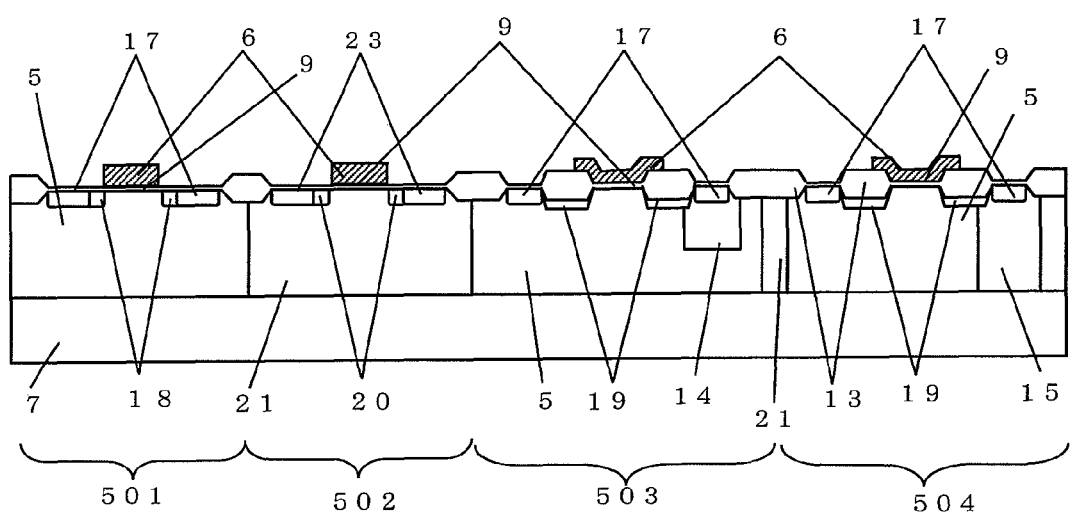
FIG. 4 is a schematic diagram for illustrating a second embodiment of the present invention.

Next, a second embodiment of the present invention is described referring to FIG. 4. FIG. 4 is a schematic sectional view of the second embodiment of the present invention, for illustrating sectional structures of the low withstanding-voltage NMOS transistor 501, the low withstanding-voltage PMOS transistor 502, the first high withstanding-voltage NMOS transistor 503, and the second high withstanding-voltage NMOS transistor 504 with changes in the structures of the first embodiment. Specifically, a drain structure of the second high withstanding-voltage NMOS transistor 504 is different from that of the first embodiment. In the second embodiment, the second high withstanding-voltage transistor 504 includes the fourth N-type low-concentration impurity region 15 in place of the third N-type low-concentration impurity regions 14 that are used as deeply diffused regions formed in the drain region in the first high withstanding-voltage NMOS transistor 503.

The diffusion depth of the fourth N-type low-concentration impurity region 15 is larger than that of the third N-type low-concentration impurity regions 14 and is as large as that of the P-type well region 5. The fourth N-type low-concentration impurity region 15 does not have a double diffusion structure with the P-type well region 5. Accordingly, a bottom surface of the fourth N-type low-concentration impurity region 15 is in contact with the N-type semiconductor substrate 7. A power supply voltage at the highest potential is normally applied to the N-type semiconductor substrate 7. Accordingly, the fourth N-type low-concentration impurity region 15 that is in contact with the N-type semiconductor substrate 7 and the drain terminal of the second high withstanding-voltage NMOS transistor connected thereto have the power supply voltage at the high potential. The mode of use described above can be adopted for all the high withstanding-voltage NMOS transistors in which the drain terminal and the power supply terminal are brought at the same potential in the circuit. As an example in which the above-mentioned mode of use is necessarily required in the semiconductor integrated circuit device, the electrostatic noise protection element 504 illustrated in FIG. 2 is given, which protects the semiconductor integrated circuit device from the electrostatic noise externally intruding into the power supply terminal. Specifically, the second high withstanding-voltage NMOS transistor 504 has an OFF configuration in which the drain terminal of the second high withstanding-voltage NMOS transistor is connected to the power supply terminal 106 whereas the source terminal and the gate terminal thereof are connected to the ground terminal 105, and has the role of releasing the electrostatic noise from the drain terminal to the ground terminal by the avalanche breakdown only when the electrostatic noise intrudes.

As in the case of the first high withstanding-voltage NMOS transistor 503 illustrated in the sectional view of FIG. 4, the third N-type low-concentration impurity region 14, which is formed in the drain region within the P-type well region 5 to have a depth that allows the third N-type low-concentration impurity region 14 to be separated away from the semiconductor substrate 7 by a given distance, is required to be determined based on the trade-off relationship between the resistance to the heat generation caused by the electrostatic noise and the reduction in the longitudinal withstanding voltage due to the punch-through phenomenon with respect to the impurity concentration and the diffusion depth from the surface of the semiconductor substrate as described above. Accordingly, a condition setting range is narrow. On the other hand, in the second high withstanding-voltage NMOS transistor 504, the fourth N-type low-concentration impurity region 15 and the N-type semiconductor substrate 7 are in contact with each other. Accordingly, the longitudinal withstanding voltage corresponding to the latter element in the above-mentioned trade-off relationship is not required to be taken into consideration. Accordingly, the structure may be optimized in consideration only of the resistance to the heat generation caused by the electrostatic noise. Thus, the above-mentioned structure is advantageous in the effect of reducing the required area and cost reduction realized thereby.

Specifically, in the second high withstanding-voltage NMOS transistor 504, the N-type low-concentration impurity region formed in the drain region is in contact with the N-type semiconductor substrate. Accordingly, a volume of the N-type diffused region connected to the drain terminal, which is required for the electrostatic noise immunity, is remarkably larger than that of the first high withstanding-voltage NMOS transistor 503. Accordingly, in order to obtain the ESD breakdown strength equal to that of the first high withstanding-voltage NMOS transistor, a channel width required in proportional to the ESD breakdown strength can be reduced to ⅔ or smaller of that of the first high withstanding-voltage NMOS transistor 503.

Further, in the second embodiment, by employing the second high withstanding-voltage NMOS transistor 504, the semiconductor integrated circuit device including the N-type semiconductor substrate that is required to be operated at a high voltage of 50 V or higher can be realized for some circuit configurations.

First, the second high withstanding-voltage NMOS transistor 504 itself does not have any restriction for the longitudinal withstanding voltage due to the punch-through phenomenon. Accordingly, for the higher withstanding voltage to the voltage between the drain and the source, the extension of a depletion layer with the high voltage is ensured by further reducing the concentration of the second N-type low-concentration impurity regions 19 and the extension of the size thereof. In this manner, the semiconductor integrated circuit device can be operated at a high voltage of 50 V or higher.

On the other hand, for an internal circuit for high-voltage signal processing, the circuit is set so that the high voltage is divided by cascode connection of the first high withstanding-voltage NMOS transistor 503 or the high withstanding-voltage PMOS transistor 505. In this manner, the application voltage for each element is reduced. As a result, a circuit operation at the high voltage of 50 V or higher can be realized.

Next, a structure of the second high withstanding-voltage NMOS transistor 504 of the present invention illustrated in FIG. 4 is described. Basic structures of the gate electrode 6, the gate insulating film 9, the second N-type low-concentration impurity regions 19, and the insulating film 13 having a thickness larger than that of the gate insulating film 9, which is formed on the second N-type low-concentration impurity regions 19, are the same as those of the first high withstanding-voltage NMOS transistor 503.

On the other hand, the fourth N-type low-concentration impurity region 15 that is a difference of the second high withstanding-voltage NMOS transistor 504 from the first high withstanding-voltage NMOS transistor 503 includes a region not for forming the P-type well region 5. In the region, phosphorus, which is the N-type impurities, is diffused at a concentration of from $8\times10^{15}/cm^3$ to $4\times10^{16}/cm^3$ to have a diffusion depth of from 7 μm to 10 μm from the surface of the semiconductor substrate. Specifically, an N-type well region 21 for forming the low withstanding-voltage or high withstanding-voltage PMOS transistor may also be formed as the fourth N-type low-concentration impurity region 15. With the configuration described above, a special step is not additionally required. Thus, the fourth N-type low-concentration impurity region 15 can be formed without increasing process costs.

Further, by using the N-type well region 21 as the fourth N-type low-concentration impurity region 15, a self-alignment twin-well process can be employed. In this manner, the fourth N-type low-concentration impurity region 15 can be formed so as to be precisely adjacent to the P-type well region 5. Further, a position of a PN junction is not moved due to mutual diffusion in the fourth N-type low-concentration impurity region 15 and the P-type well region 5. Accordingly, in contrast to the third N-type low-concentration impurity region 14, the spread of diffusion in a transverse direction in the fourth N-type low-concentration impurity region 15 can be suppressed. That is, the second high withstanding-voltage NMOS transistor 504 of the second embodiment has an advantage in cost reduction by making the channel width for electrostatic noise absorption shorter than that of the first high withstanding-voltage NMOS transistor as described above and making a plane size of the fourth N-type low-concentration impurity region 15 smaller than that of each of the third N-type low-concentration impurity regions 14.

Third Embodiment

Figure 5:
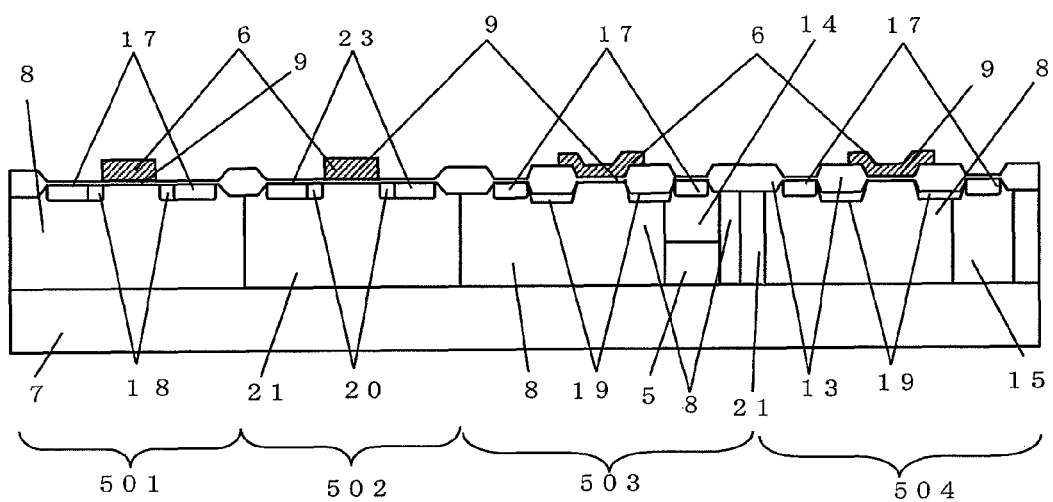
FIG. 5 is a schematic diagram for illustrating a third embodiment of the present invention.
Figure 6A:
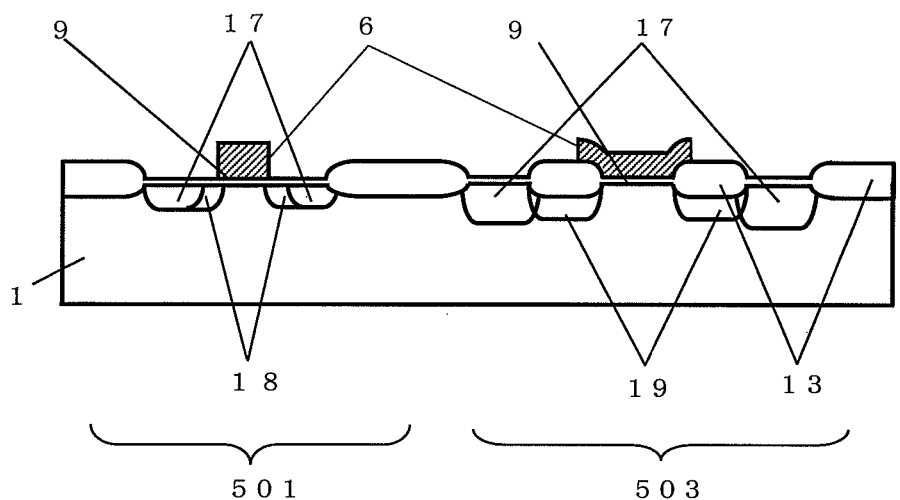
FIG. 6A and FIG. 6B are schematic sectional views of related-art low withstanding-voltage NMOS transistor and high withstanding-voltage NMOS transistor.
Figure 6B:
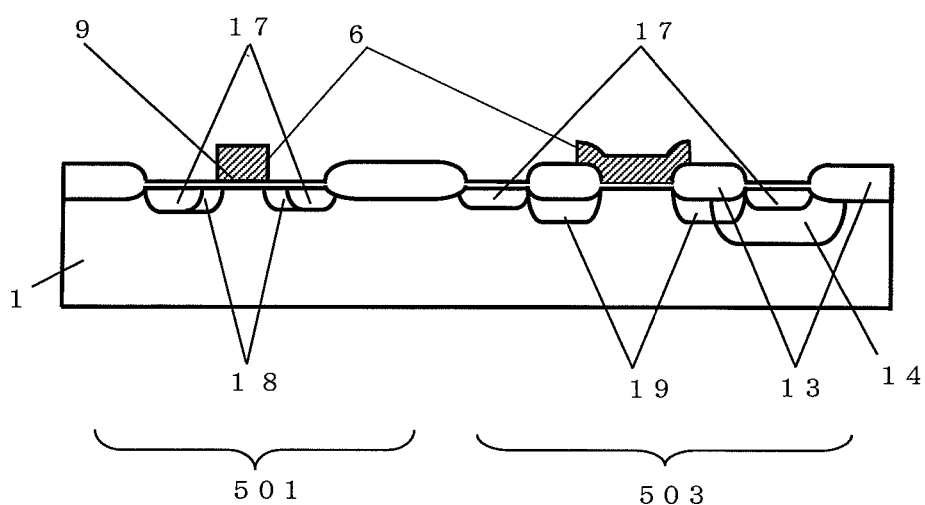

Next, a third embodiment of the present invention is described referring to FIG. 5. FIG. 5 is a schematic sectional view of the third embodiment of the present invention, for illustrating sectional structures of the low withstanding-voltage NMOS transistor 501, the low withstanding-voltage PMOS transistor 502, the first high withstanding-voltage NMOS transistor 503, and the second high withstanding-voltage NMOS transistor 504 with changes in the structures of the second embodiment. The third embodiment differs from the second embodiment in the impurity concentration in a part of the P-type well region.

First, in the first high withstanding-voltage NMOS transistor 503, the third N-type low-concentration impurity region 14 that is a deep diffused region is formed in the drain region as in the case of the first embodiment and the second embodiment. Although the first P-type well region 5 that is present below the N-type low-concentration impurity region 14 and between the N-type low-concentration impurity region 14 and the N-type semiconductor substrate 7 is the same as that of the second embodiment, second P-type well regions 8 adjacent to the third N-type low-concentration impurity region 14 has a P-type impurity concentration higher than that of the first P-type well region 5.

The second P-type well regions 8 and the third N-type low-concentration impurity region 14 are formed by the self-alignment twin-well process described later as in the case of the first P-type well region 5 and the N-type well regions 21. Accordingly, a position of junction between the second P-type well regions 8 and the third N-type low-concentration impurity region 14 precisely matches and the second P-type well regions 8 and the third N-type low-concentration impurity region 14 are not shifted from the positions at which the regions are formed at the time of impurity ion implantation. Accordingly, the spread of diffusion in the transverse direction in the third N-type low-concentration impurity region 14 and an increase in the required area for the first high withstanding-voltage NMOS transistor caused thereby are suppressed, thereby being capable of contributing to the cost reduction of the semiconductor integrated circuit device.

Further, the third embodiment also differs from the second embodiment in that the second P-type well regions 8 are used as the P-type well regions of the low withstanding-voltage NMOS transistor 501 and the second high withstanding-voltage NMOS transistor 504 and have the higher P-type impurity concentration. In this case, the second P-type well region 8 and the N-type well region 21 are also formed in a self-aligned manner without causing a shift in the position of junction. The second P-type well regions 8 are formed by using, as the P-type impurities, boron or $BF_2$ at a concentration of from $5 \times 10^{16}/cm^3$ to $2 \times 10^{17}/cm^3$ to keep an impurity concentration higher than that of the first P-type well regions.

When the P-type well region having the high impurity concentration described above is used for the low withstanding-voltage NMOS transistor 501, a short channel effect such as the reduction in withstanding voltage due to the punch-through phenomenon is suppressed as compared with the case where the first P-type well region 5 is used. Accordingly, the minimum gate length can be set to 0.5 μm. In this case, the low withstanding-voltage NMOS transistor can deal with the voltage signal processing up to 6 V by the optimization of, in particular, the structure of the first N-type low-concentration impurity region. Specifically, the third embodiment has effects in that cost reduction of the semiconductor integrated circuit device having the output voltage of 6 V or lower can be promoted while reducing the required area by employing a detailed rule as compared with the other embodiments.

Fourth Embodiment

Next, a manufacturing method for realizing the first embodiment of the present invention is described referring to sectional views of FIG. 7 to FIG. 9 for illustrating a step flow.

Figure 7A:
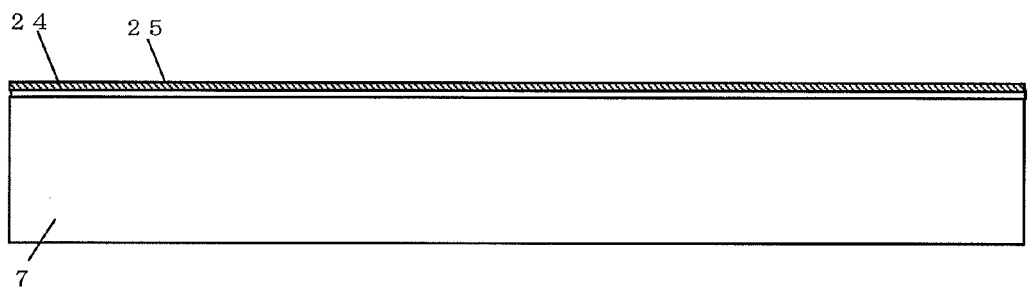
FIG. 7A, FIG. 7B, and FIG. 7C are sectional views for illustrating a step flow for illustrating the first embodiment of the present invention.
Figure 7B:
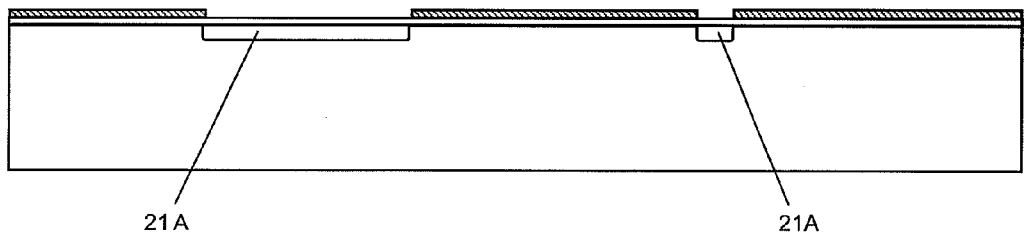
Figure 7C:
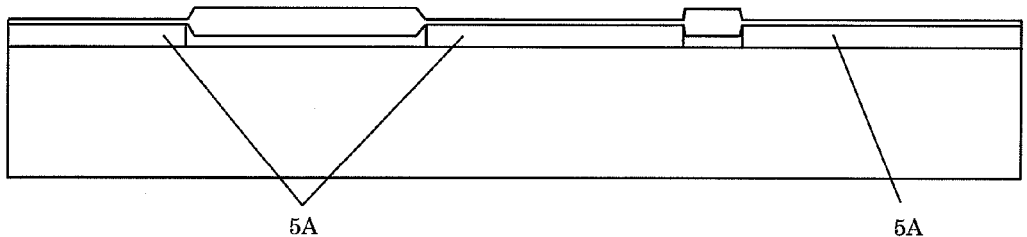
Figure 8A:
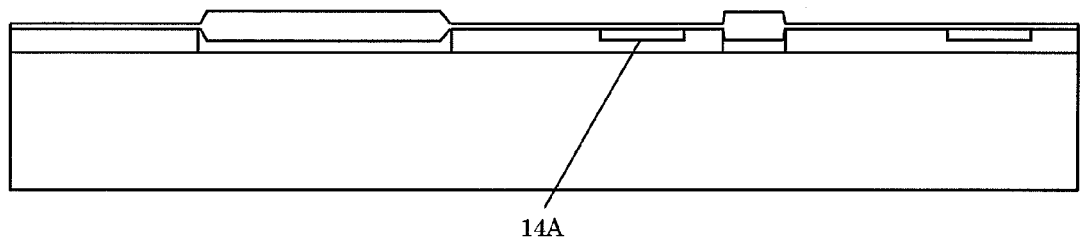
FIG. 8A, FIG. 8B, and FIG. 8C are sectional views subsequent to FIG. 7C, for illustrating the step flow for illustrating the first embodiment of the present invention.

First, the N-type semiconductor substrate 7 containing phosphorous at a concentration of from $3 \times 10^{14}/cm^3$ to $8 \times 10^{14}/cm^3$ is prepared. On the N-type semiconductor substrate 7, a silicon oxide film 24 having a thickness of from 100 Å to 500 Å is formed by a thermal oxidation. On the silicon oxide film 24, a silicon nitride film 25 having a thickness of from 300 Å to 1,500 Å is further formed on the silicon oxide film 24 by low pressure chemical vapor deposition (LPCVD) (FIG. 7A).

Next, the silicon nitride film formed on a region for forming the N-type well region is removed by photolithography and dry etching. By using the silicon nitride film and a photoresist as masks, phosphorus that is the N-type impurity is implanted by ion implantation at a dose amount of from about $3 \times 10^{12}/cm^2$ to about $3 \times 10^{13}/cm^2$ through the exposed silicon oxide film, to thereby form a region 21A implanted with phosphorous. Thereafter, the photoresist is removed (the region implanted with phosphorus is indicated by the reference symbol 21A in FIG. 7B).

Next, a silicon oxide film having a thickness of from 1,000 Å to 3,000 Å is selectively formed on a region for forming the N-type well region, by using the remaining nitride film as a mask through the thermal oxidation. Next, after the removal of the nitride film, a P-type impurity, boron or $BF_2$, is at a dose amount of from about $2 \times 10^{12}/cm^2$ to about $1 \times 10^{13}/cm^2$ is implanted into regions 5A for forming the P-type well region, except regions for forming the N-type well region, in a self-aligned manner by using the above-mentioned silicon oxide film having the thickness of from 1,000 Å to 3,000 Å as a mask (the P-type impurity implanted region is indicated by the reference symbol 5A in FIG. 7C).

By the twin-well process described above, the P-type well region and the N-type well region can be formed so as to be precisely adjacent to each other with the single photomask.

Next, a region for forming the third N-type low concentration impurity region is implanted with arsenic that is the N-type impurity at a dose amount of from about $8 \times 10^{12}/cm^2$ to about $7 \times 10^{13}/cm^2$ by the ion implantation through the silicon oxide film by using a photoresist as a mask to form a region 14A implanted with arsenic. Thereafter, the photoresist is removed (the region implanted with arsenic is indicated by the reference symbol 14A in FIG. 8A).

Figure 8B:
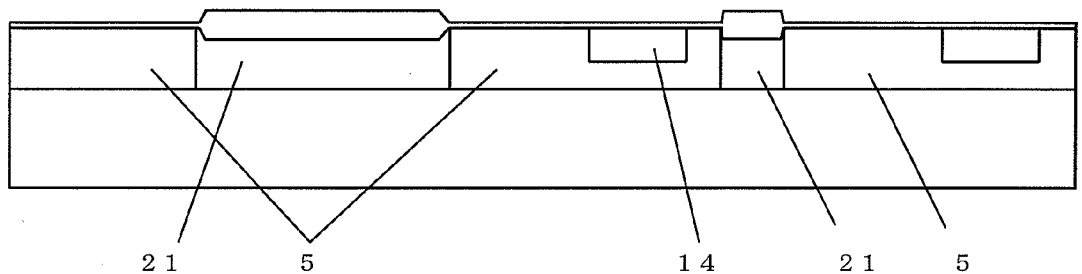
Figure 8C:
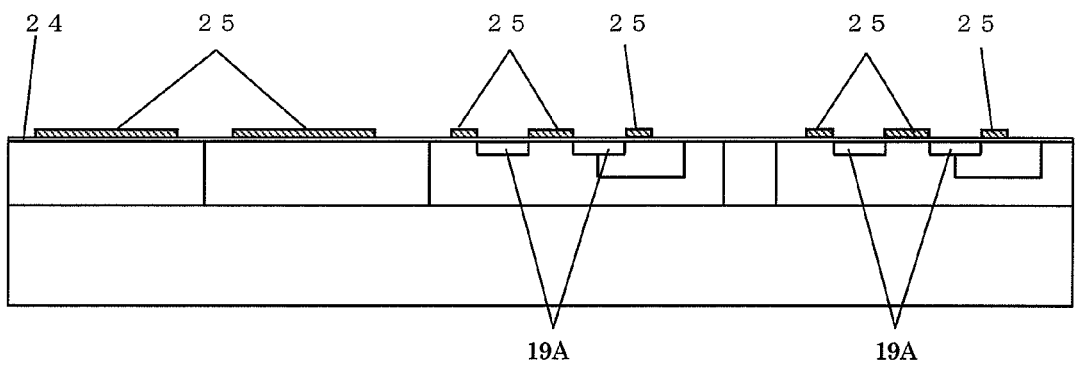

Next, the N-type impurities and the P-type impurities are diffused simultaneously by a thermal treatment at a temperature of from 1,170° C. to 1,200° C. for from about 15 hours to about 20 hours to obtain the P-type well regions 5, the N-type well regions 21, and the third N-type low-concentration impurity region 14, each having a desired diffusion depth (FIG. 8B).

Through the steps described above, the N-type well regions containing phosphorus that is the N-type impurity at the impurity concentration of $8 \times 10^{15}/cm^3$ to $4 \times 10^{16}/cm^3$ with the diffusion depth of from 7 μm to 10 μm from the surface of the semiconductor substrate, the P-type well regions containing boron or $BF_2$ at the P-type impurity concentration of $8 \times 10^{15}/cm^3$ to $4 \times 10^{16}/cm^3$ with the diffusion depth of from 7 μm to 10 μm from the surface of the semiconductor substrate, and the third N-type low-concentration impurity region containing arsenic at the impurity concentration of $2 \times 10^{16}/cm^3$ to $1 \times 10^{18}/cm^3$ with the diffusion depth of from 2 μm to 3.5 μm from the surface of the semiconductor substrate can be formed.

In the present invention, the high-temperature long-time thermal treatment at 1,100° C. or higher is used not only for the simultaneous impurity diffusion and formation of the P-type well regions and the N-type well regions in the self-aligned manner but also for the impurity diffusion for the formation of the third N-type low-concentration impurity region. At this time, arsenic is selected as the N-type impurities. By using a difference in diffusion coefficient between arsenic and boron or $BF_2$ for forming the p-type well regions, the impurities are diffused deeply in the P-type well region and the impurity is diffused shallowly in the third N-type low-concentration impurity region through the single thermal treatment. In this manner, condition for implantation and condition for diffusion are adjusted so that the third N-type low-concentration impurity region 14 can be formed in the P-type well region to have a double diffusion structure.

By appropriately adjusting the amount of the N-type impurities implanted in the third N-type low-concentration impurity region with the method of the present invention described above, a relationship between the process conditions and the withstanding voltage as shown in FIG. 3 can be obtained. It is clarified that the method of the present invention can be used for the semiconductor integrated circuit devices having various input voltage specifications even when the N-type semiconductor substrate is used.

Next, after the entire silicon oxide film is once removed from the surface of the semiconductor substrate, the silicon oxide film 24 having a thickness of from 100 Å to 500 Å is formed by the thermal oxidation. On the silicon oxide film 24, the silicon oxide film 25 having a thickness of from 300 Å to 1,500 Å is further formed by the LPCVD. Next, in order to form the second N-type low-concentration impurity regions, the silicon nitride film is removed by the photolithography and the dry etching. Then, phosphorus that is the N-type impurity is implanted into regions 19A by the ion implantation at a dose amount of from about $1\times10^{12}/cm^2$ to about $7\times10^{12}/cm^2$ through the silicon oxide film by using the silicon nitride film and the photoresist as the masks. Then, the photoresist is removed (the N-type impurity implanted regions are indicated by the reference symbol 19A in FIG. 8C).

The second N-type low-concentration impurity regions are set so as to adjust the withstanding voltage between the drain and the source of the high withstanding-voltage transistor, and the dose amount is preferred to be from about $1\times10^{17}/cm^2$ to about $1\times10^{18}/cm^2$. However, for the purpose of reducing process costs, the second N-type low-concentration impurity region may be formed simultaneously with the impurity implantation for a channel stopper that is provided for element isolation (not shown).

Figure 9A:
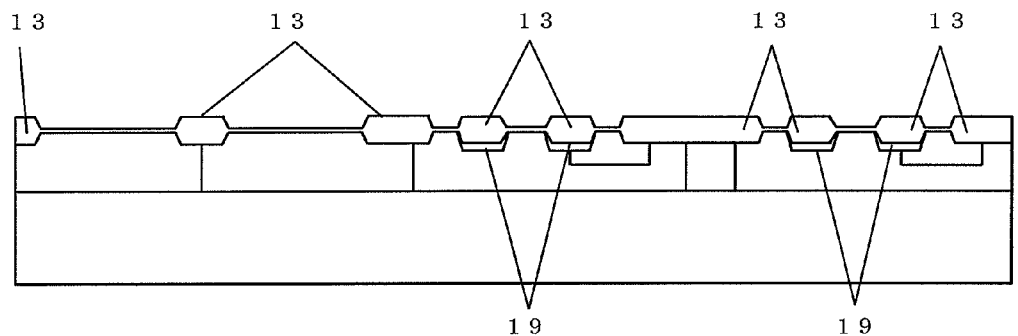
FIG. 9A, FIG. 9B, and FIG. 9C are sectional views subsequent to FIG. 8C, for illustrating the step flow for illustrating the first embodiment of the present invention.

Next, the silicon oxide film having a thickness of from 6,000 Å to 12,000 Å is selectively formed on a region for forming the second N-type low-concentration impurity region, by the thermal oxidation using the remaining nitride film as a mask. Thereafter, the silicon nitride film is peeled off (FIG. 9A). The thermally-oxidized film having the thickness of from 6,000 Å to 12,000 Å is an insulator formed to have a thickness larger than that of the gate insulating film for the purpose of obtaining an electric field relaxation effect between the gate and the drain of the high withstanding-voltage NMOS transistor. By forming the thermally-oxidized film also as a local oxidation of silicon (LOCOS) insulating film in an element isolation region, the process costs can be reduced.

Figure 9B:
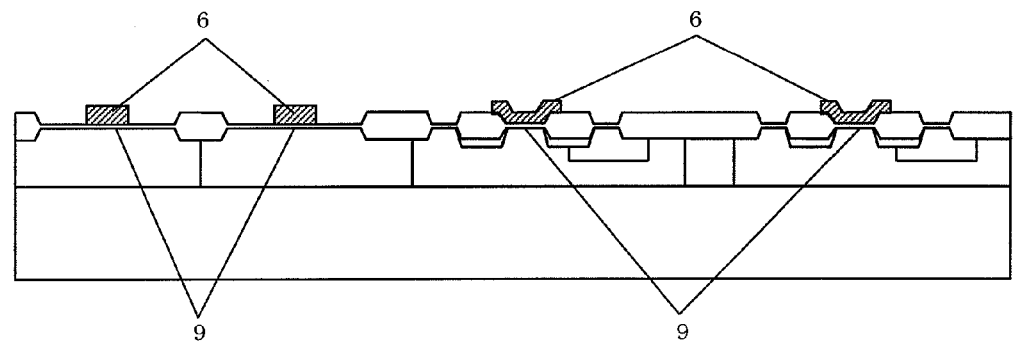

Next, after channel impurity implantation for threshold-value voltage control for the MOS transistors and the formation of the gate insulating film 9 of each of the MOS transistors are performed as needed, a polycrystalline silicon film having a thickness of from 2,000 Å to 5,000 Å is formed to form the gate electrodes 6. The impurity implantation at a high density is carried out by the ion implantation or the thermal diffusion method so as to achieve the impurity concentration of $1\times10^{19}/cm^3$ or higher. Thereafter, the polycrystalline silicon film is processed into a desired shape by using the photolithography and the dry etching (FIG. 9B).

Next, the first N-type low-concentration impurity regions 18 for the purpose of electric field relaxation between the drain and the source of the low withstanding-voltage NMOS transistor and the P-type low-concentration impurity regions 20 for the purpose of electric field relaxation between the drain and the source of the low withstanding-voltage PMOS transistor are formed. The conditions of the formation of each of the regions are determined based on a desired operating voltage. The N-type impurities and the P-type impurities are implanted at the dose amount of from about $2\times10^{12}/cm^2$ to about $2\times10^{14}/cm^2$ by the ion implantation.

Figure 9C:
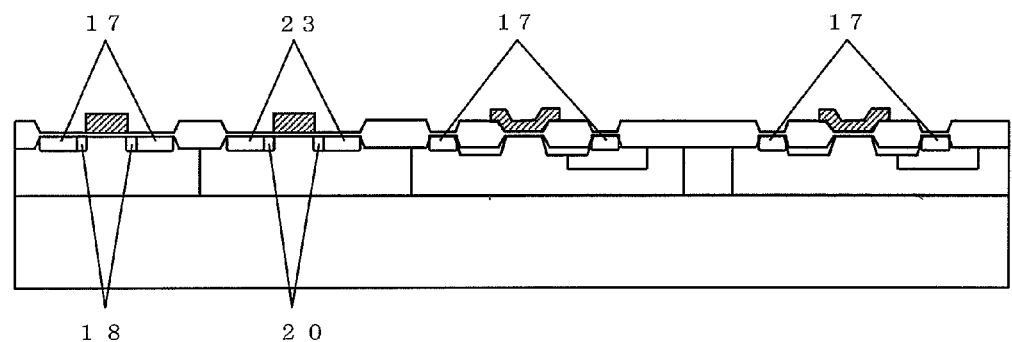

Next, the N-type high-concentration impurity regions 17 for the extraction of the drain terminals and the source terminals of the low withstanding-voltage NMOS transistor and the high withstanding-voltage NMOS transistors and the P-type high-concentration impurity regions 23 for the extraction of the drain terminal and the source terminal of the low-withstanding voltage PMOS transistor are formed by implantation at the dose amount of $2\times10^{15}/cm^2$ or higher by the ion implantation (FIG. 9C).

Next, although not shown, an insulating film formed of an oxide film is formed entirely. Contact holes are formed at predetermined positions by using the dry etching so as to extract terminal electrodes of the MOS transistors. Next, after a metal film made of aluminum is formed by sputtering so as to form metal wirings that are provided for applying a potential to the terminals, the metal film is processed by the dry etching to form the metal wirings.

By using the manufacturing method of the first embodiment described above, the semiconductor integrated circuit including the high withstanding-voltage NMOS transistors that ensures both the withstanding voltage of 30 V or higher and the breakdown strength to the heat generation caused by the electrostatic noise can be manufactured by using the N-type semiconductor substrate.

Fifth Embodiment

Next, a manufacturing method for realizing the second embodiment of the present invention is described referring to sectional views of FIG. 10 to FIG. 12 for illustrating a step flow.

Figure 10A:
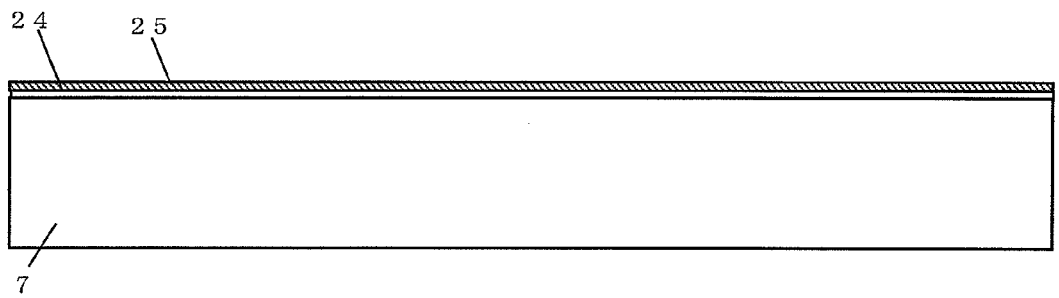
FIG. 10A, FIG. 10B, and FIG. 10C are sectional views for illustrating a step flow for illustrating the second embodiment of the present invention.

First, as in the manufacturing method for the first embodiment, the silicon oxide film 24 is formed on the N-type semiconductor substrate 7 containing phosphorous at a concentration of from $3\times10^{14}/cm^3$ to $8\times10^{14}/cm^3$ by the thermal oxidation, and the silicon nitride film 25 is formed thereon by the LPCVD (FIG. 10A).

Figure 10B:
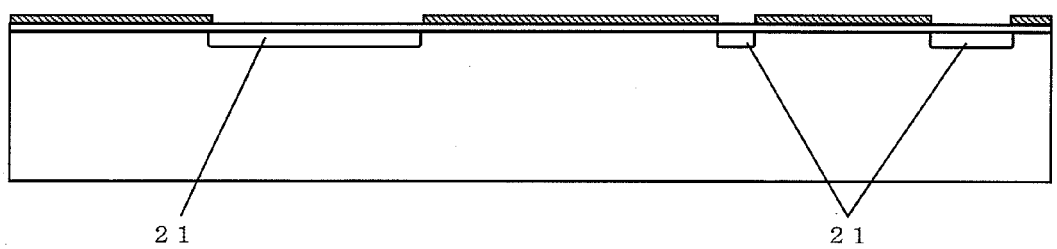
Figure 10C:
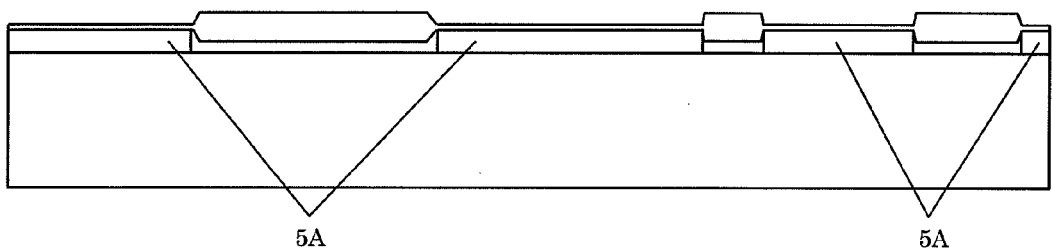

Next, the silicon nitride film that is present on regions for forming the N-type well regions is removed. Through the exposed silicon oxide film, phosphorus that is the N-type impurity is implanted by the ion implantation at the dose amount of from about $3\times10^{12}/cm^2$ to about $3\times10^{13}/cm^2$. Thereafter, the photoresist is peeled off (FIG. 10B). The N-type well regions 21 formed in this manufacturing method differ from those manufactured by the manufacturing method for the first embodiment in that the N-type well regions 21 are formed not only in the low withstanding-voltage PMOS transistor and the high withstanding-voltage PMOS transistor but also additionally in a region for forming the drain region 15 of the second high withstanding-voltage NMOS transistor.

Next, a silicon oxide film having a thickness of from 1,000 Å to 3,000 Å is formed on a region for forming the N-type well region. After the removal of the nitride film, a P-type impurity, boron or $BF_2$, is implanted into regions 5A at a dose amount of from about $2\times10^{12}/cm^2$ to about $1\times10^{13}/cm^2$ by ion implantation by using the above-mentioned silicon oxide film as a mask (the P-type impurity implanted region is indicated by the reference symbol 5A in FIG. 10C).

Figure 11A:
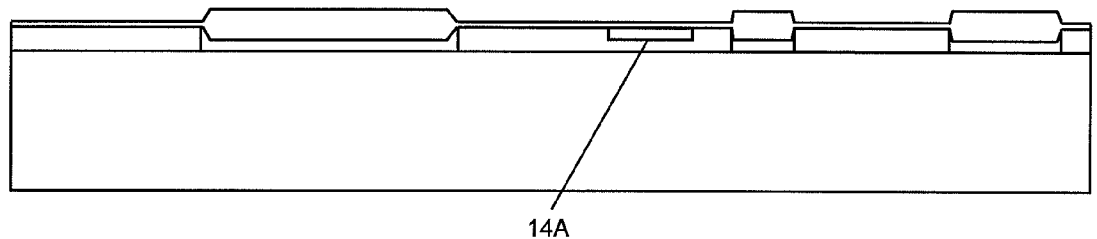
FIG. 11A, FIG. 11B, and FIG. 11C are sectional views subsequent to FIG. 10C, for illustrating the step flow for illustrating the second embodiment of the present invention.
Figure 12A:
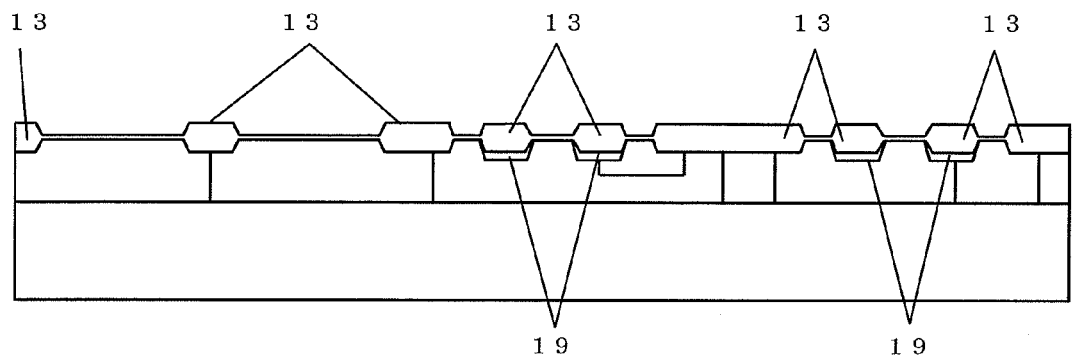
FIG. 12A, FIG. 12B, and FIG. 12C are sectional views subsequent to FIG. 11C, for illustrating the step flow for illustrating the second embodiment of the present invention.
Figure 12B:
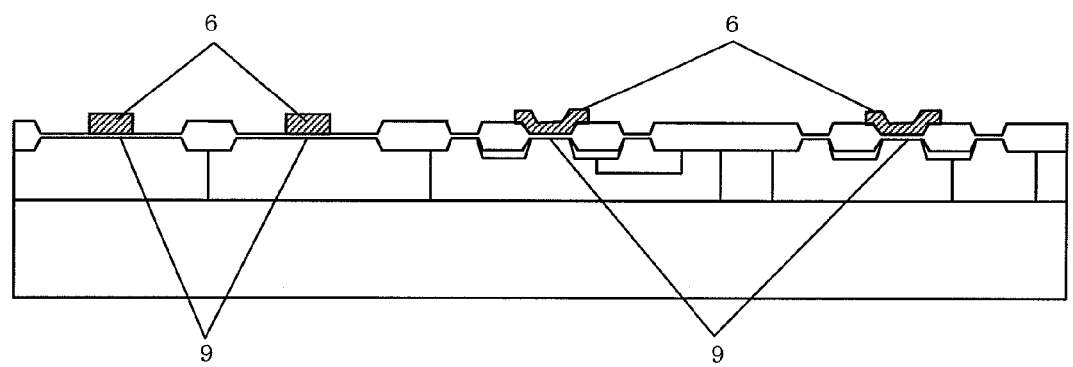
Figure 12C:
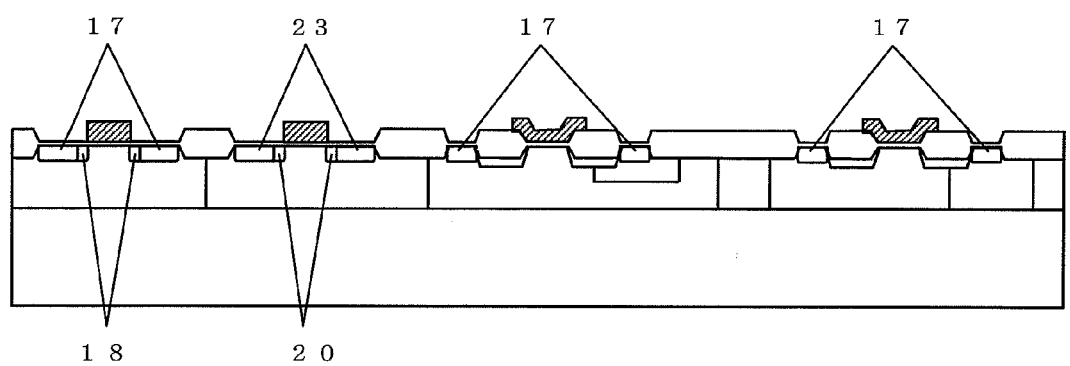

Next, a region 14A for forming the third N-type low concentration impurity region of the first high withstanding-voltage NMOS transistor is implanted with arsenic that is an N-type impurity at a dose amount of from about $8\times10^{12}/cm^2$ to about $7\times10^{13}/cm^2$ by the ion implantation through the silicon oxide film by using a photoresist as a mask (the region implanted with arsenic is indicated by the reference symbol 14A in FIG. 11A).

Figure 11B:
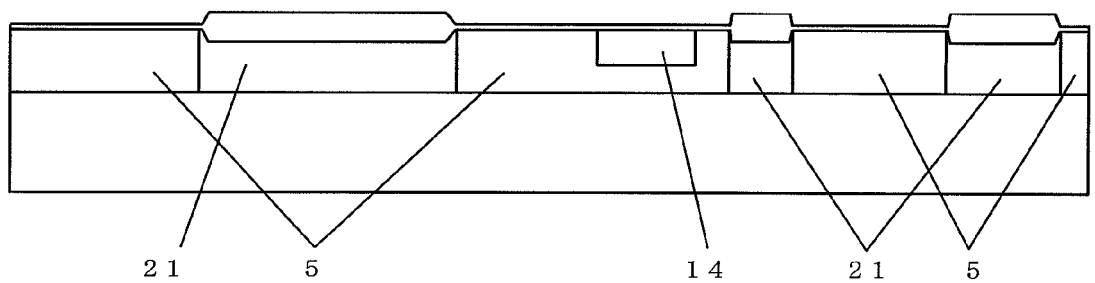
Figure 11C:
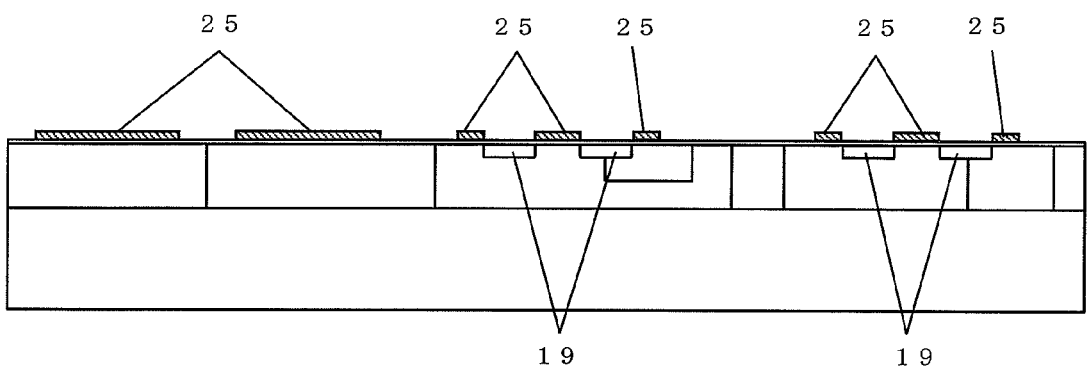

Next, the N-type impurities and the P-type impurities are diffused simultaneously by a thermal treatment at a temperature of from 1,170° C. to 1,200° C. for from about 15 hours to about 20 hours to obtain the N-type well regions, the P-type well regions, and the third N-type low-concentration impurity region, each having a desired diffusion depth (FIG. 11B).

As described above, the deep diffusion for the drain regions of the first high withstanding-voltage NMOS transistor and the second high withstanding-voltage NMOS transistor is separately formed. By using the N-type well region for the fourth N-type low-concentration impurity region of the second high-voltage NMOS transistor, the second embodiment can be realized without increasing the number of manufacturing steps from that of the first embodiment.

Then, through the formation of the second N-type low-concentration impurity region (FIG. 11C), the formation of the insulating film and the element isolation insulating film on the second N-type low-concentration impurity regions (FIG. 12A), the formation of the gate insulating film and the gate electrodes (FIG. 12B), the formation of the drain regions and the source regions of the low withstanding-voltage MOS transistor and the high withstanding-voltage MOS transistor (FIG. 12C), and the formation of the contact holes and the metal wirings (not shown), the semiconductor integrated circuit device is completed.

By the manufacturing method for the second embodiment described above, the semiconductor integrated circuit device including the second high withstanding-voltage NMOS transistor requiring a further reduced area as a protection element between the power supply terminal and the ground terminal in addition to the first high withstanding-voltage NMOS transistor that ensures both the withstanding voltage of 30 V or higher and even 50 V or higher by devising the circuit configuration and the breakdown strength to the heat generation caused by the electrostatic noise can be manufactured by using the N-type semiconductor substrate.

Sixth Embodiment

Next, a manufacturing method for realizing the third embodiment of the present invention is described referring to sectional views of FIG. 13 to FIG. 15 for illustrating a step flow.

Figure 13A:
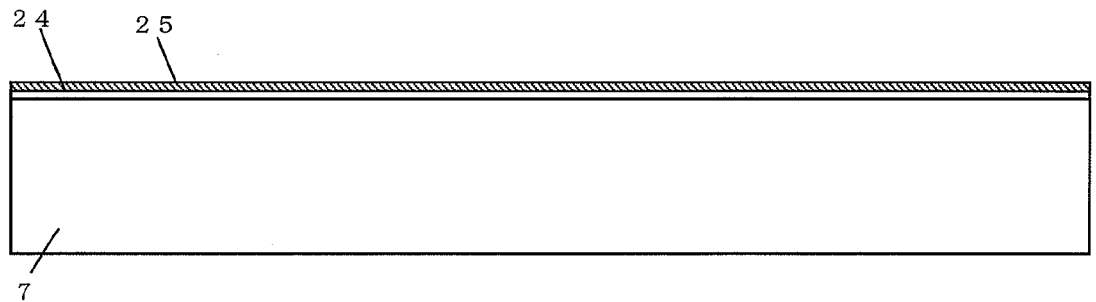
FIG. 13A, FIG. 13B, and FIG. 13C are sectional views for illustrating a step flow for illustrating the third embodiment of the present invention.
Figure 13B:
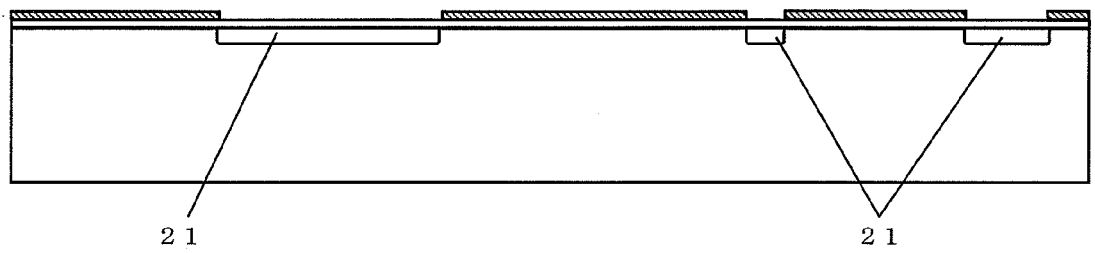

First, as in the manufacturing method for the second embodiment, the silicon oxide film is formed on the N-type semiconductor substrate, and the silicon nitride film is formed thereon (FIG. 13A). After the removal of the silicon nitride film from regions for forming the N-type well regions, phosphorous that is the N-type impurity for the formation of the N-type well regions is implanted by the ion implantation through the exposed silicon oxide film (FIG. 13B). Thereafter, the photoresist is peeled off. Subsequently, the silicon oxide film is formed by the thermal oxidation on regions for forming the N-type well regions. After the removal of the nitride film, the P-type impurity implantation to form the first P-type well region, for implanting a P-type impurity, boron or $BF_2$, using the silicon oxide film as the mask, is carried out to regions 5A not masked by the silicon oxide (the P-type well regions formed thereby are indicated by the reference symbol 5A in FIG. 13C). By the first self-alignment twin-well process described above, the first P-type well regions and the N-type well regions can be formed so as to be precisely adjacent to each other.

Figure 14A:
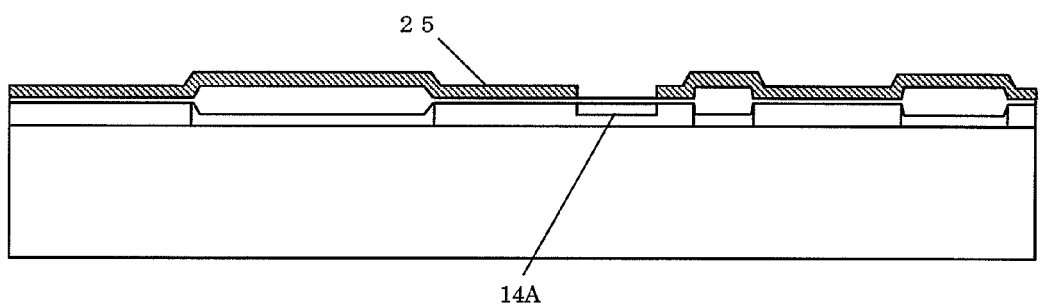
FIG. 14A, FIG. 14B, and FIG. 14C are sectional views subsequent to FIG. 13C, for illustrating the step flow for illustrating the third embodiment of the present invention.
Figure 14B:
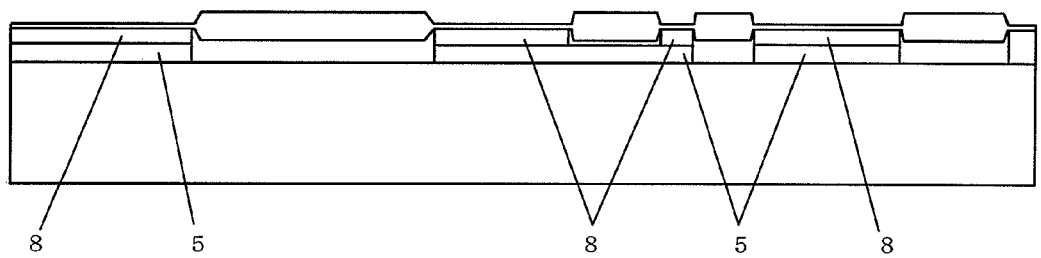
Figure 14C:
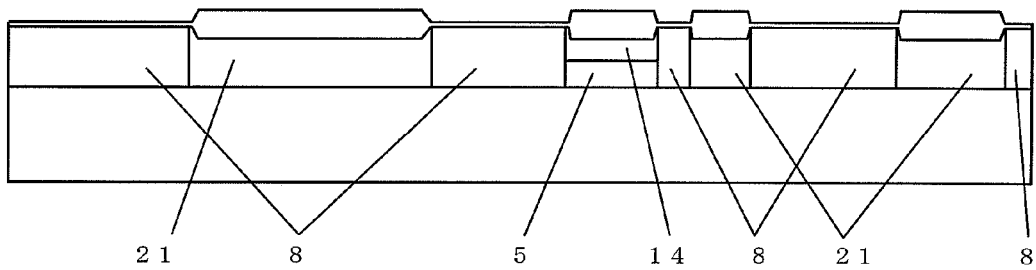

The following steps in FIG. 14A to FIG. 14C are specific to the manufacturing method for the third embodiment.

Figure 13C:
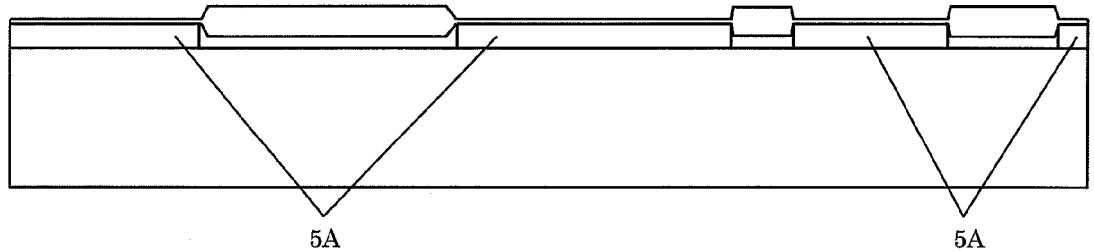

Subsequent to FIG. 13C, the silicon nitride film 25 is formed by the LPCVD. An opening is formed through a region of the silicon nitride film, on which the third N-type low-concentration impurity regions are to be formed, by the photolithography and the dry etching. An N-type impurity, arsenic, is implanted in to a region 14A by the ion implantation at a dose amount of from about $8 \times 10^{12}/cm^2$ to about $7 \times 10^{13}/cm^2$ through the exposed silicon oxide film by using the silicon nitride film and the photoresist as the masks. Thereafter, the photoresist is removed (the arsenic implanted region is indicated by the reference symbol 14A in FIG. 14A).

Next, a silicon oxide film having a thickness of from 1,000 Å to 3,000 Å is selectively formed on regions for forming the third N-type low-concentration impurity regions, by using the remaining nitride film as a mask through the thermal oxidation. Next, after the removal of the nitride film, boron or $BF_2$ that is a P-type impurity is implanted at a dose amount of from about $5 \times 10^{12}/cm^2$ to about $2 \times 10^{13}/cm^2$ by ion implantation by using the above-mentioned silicon oxide film having the thickness of from 1,000 Å to 3,000 Å as a mask. By further implanting the P-type impurity in addition to the P-type impurity implantation for the formation of the first P-type well regions, in the implanted regions, the second P-type well regions 8 having an impurity concentration higher than that of the first P-type well regions are formed (FIG. 14B). Further, the silicon oxide film having the thickness of from 1,000 Å to 3,000 Å remains on the regions for forming the N-type well regions in addition to the regions for forming the third N-type low-concentration impurity regions. Accordingly, the P-type impurities do not intrude thereto.

By employing the second self-alignment twin-well process described above, the second P-type well regions and the third N-type low-concentration impurity region can be formed so as to be precisely adjacent to each other.

Next, the N-type impurities and the P-type impurities are diffused through the thermal treatment at 1,170° C. for about 20 hours to obtain the N-type well regions, the first P-type well regions, the second P-type well regions, and the third N-type low-concentration impurity regions, each having a desired diffusion depth (FIG. 14C).

In this case, the second P-type well regions and the N-type well regions are formed so as to be adjacent to each other as illustrated in FIG. 14B, and the impurities are diffused in this state. Accordingly, the position of junction between the regions does not change. Further, the second P-type well regions and the third N-type low-concentration impurity regions are also formed so as to be adjacent to each other, and the impurities are diffused in this state. Accordingly, the position of junction between the regions does not change. Thus, by employing the manufacturing method described above in this embodiment, the definition of sizes and positions with high accuracy can be realized without changing the size of each of the impurity regions.

Further, the first P-type well regions having a lower impurity concentration are formed deeper from the surface of the semiconductor substrate and the second P-type well regions having a higher impurity concentration are formed shallower before the above-mentioned high-temperature long-time thermal treatment. Accordingly, in a region in which the first P-type well region and the second P-type well region formed by the ion implantation overlap each other, a two-step concentration profile in the depth direction is formed. As a result of the diffusion through the high-temperature long-time thermal treatment, the above-mentioned nonuniformity of the concentration profile in the depth direction is eliminated.

Through the steps described above, the N-type well regions containing phosphorus at the N-type impurity concentration of $8 \times 10^{15}/cm^3$ to $4 \times 10^{16}/cm^3$ to have the diffusion depth of from 7 μm to 10 μm from the surface of the semiconductor substrate, the second P-type well regions containing boron or $BF_2$ at the P-type impurity concentration of $8 \times 10^{15}/cm^3$ to $4 \times 10^{16}/cm^3$ to have the diffusion depth of from 7 μm to 10 μm from the surface of the semiconductor substrate, and the third N-type low-concentration impurity regions containing arsenic at the impurity concentration of $2\times10^{16}/cm^3$ to $1\times10^{18}/cm^3$ to have the depth of from 2 μm to 3.5 μm from the surface of the semiconductor substrate can be formed.

Figure 15A:
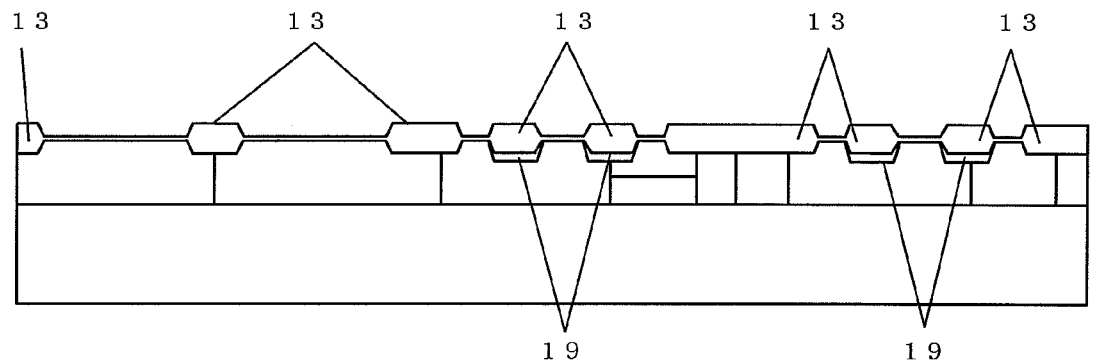
FIG. 15A, FIG. 15B, and FIG. 15C are sectional views subsequent to FIG. 14C, for illustrating the step flow for illustrating the third embodiment of the present invention.
Figure 15B:
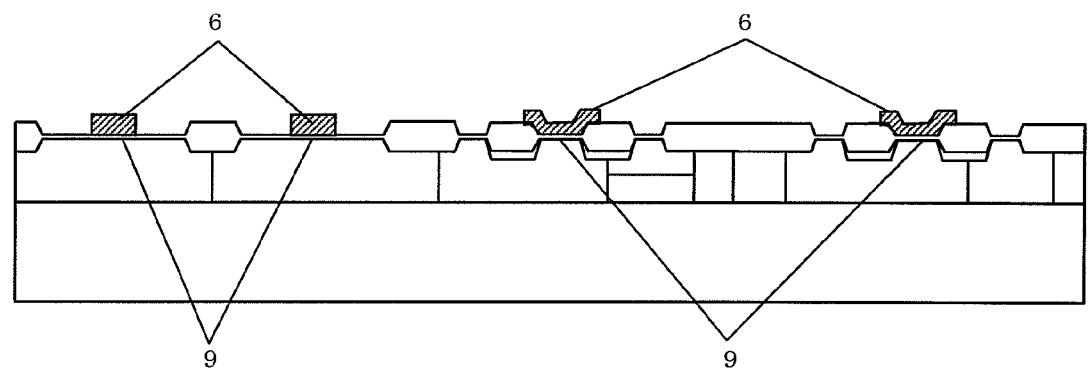
Figure 15C:
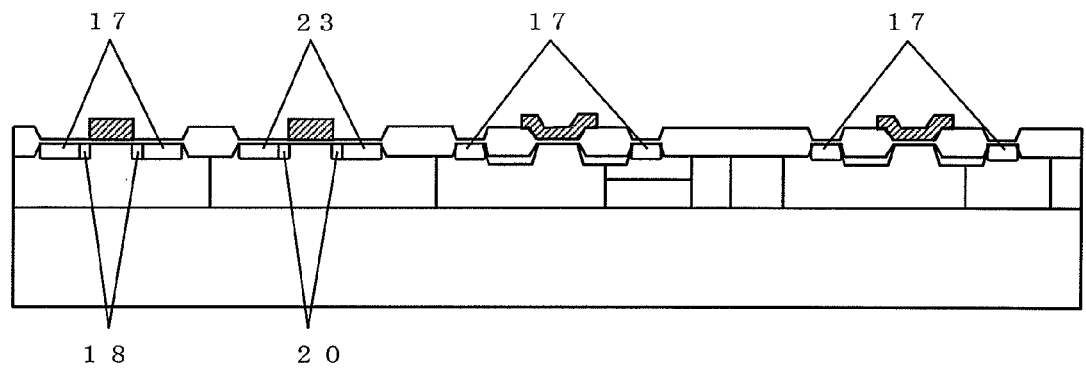

The subsequent steps illustrated in FIG. 15A to FIG. 15(3) are the same as those of the manufacturing methods for the first embodiment and the second embodiment. Specifically, through the formation of the second N-type low-concentration impurity regions, the formation of the insulating film and the element isolation insulating film on the second N-type low-concentration impurity regions (FIG. 15A), the formation of the gate insulating film and the gate electrodes (FIG. 15B), the formation of the drain regions and the source regions of the low withstanding-voltage MOS transistor and the high withstanding-voltage MOS transistors (FIG. 15C), and the formation of the contact holes and the metal wirings (not shown), the semiconductor integrated circuit device is completed.

In the description given above, in particular, the conditions for the N-type well regions are the same as those of the first embodiment and the second embodiment. However, the impurity concentration of the N-type well regions may be set higher in accordance with the impurity concentration of the second P-type well regions having the impurity concentration higher than that of the first P-type well regions. By setting the impurity concentration of the N-type well regions higher, the PN-junction withstanding voltage with the second P-type well region in which the low withstanding-voltage transistor is mounted is lowered. In this embodiment, however, the operating voltage of the low withstanding-voltage MOS transistor is lowered to 6 V or lower in contrast to the first embodiment and the second embodiment. Accordingly, there arises no problem. Meanwhile, by increasing the impurity concentration of the N-type well regions, the short channel effect such as the reduction in withstanding voltage of the low withstanding-voltage PMOS transistor due to the punch-through phenomenon is suppressed. Thus, an advantage in that the minimum gate length can be set to 0.5 μm even for the low withstanding-voltage NMOS transistor can be enjoyed.

On the other hand, there is no need of fear of the reduction in withstanding voltage of the second high withstanding-voltage NMOS transistor due to the increase in concentration of the second P-type well regions that form the channel regions even for the second high withstanding-voltage NMOS transistor. The withstanding voltage of the second high withstanding-voltage NMOS transistor is restricted by the conditions for the second N-type low-concentration impurity regions. Accordingly, there is no disadvantage in the application of the third embodiment of the present invention to the second high withstanding-voltage NMOS transistor.

Further, in a process at about 0.5 μm, the high-temperature long-time thermal treatment after the impurity implantation for the P-type well regions and the N-type well regions is generally set to 10 hours or shorter in many cases. In this manner, the diffusion depth of the well regions is reduced to facilitate an operation of a longitudinal parasitic element. As a result, although there is a fear of reduction in withstanding voltage or frequent occurrence of a latch-up phenomenon, such phenomena are actually suppressed under the effects of the reduction in operating voltage along with the reduction in size in addition to the increased impurity concentration of the P-type well regions and the N-type well regions. On the other hand, in the third embodiment of the present invention, by employing the high-temperature thermal treatment of about 20 hours, the well regions at the high concentration with the large diffusion depth are realized. Accordingly, as compared with the general 0.5 μm process, latch-up immunity is high. Thus, a planer design rule margin for the suppression of the operation of the parasitic element, which is provided for the suppression of the latch up, such as the installation of a guard ring with a high-concentration impurity layer or separation of the internal circuit from an external terminal by several tens of nanometers or larger, can be reduced, thereby contributing to the cost reduction through the reduction of the required area of the semiconductor integrated circuit device.

By the manufacturing method for the third embodiment described above, the semiconductor integrated circuit including the second high withstanding-voltage NMOS transistor requiring the reduced area as the protection element between the power supply terminal and the ground terminal in addition to the first high withstanding-voltage NMOS transistor that ensures both the withstanding voltage of 30 V or higher and even 50 V or higher by devising the circuit configuration and the breakdown strength to the heat generation caused by the electrostatic noise, the low withstanding-voltage MOS transistors that are reduced in size for the low voltage output, and a further simplified latch-up rule, to thereby realize a smaller area and reduced costs can be manufactured by using the N-type semiconductor substrate.

The present invention including the structures and the manufacturing methods described above can realize not only a step-down series regulator and a voltage detector described above but also various semiconductor integrated circuit devices that require the integration of the low withstanding-voltage transistor and the high withstanding-voltage transistor in the N-type semiconductor substrate. Accordingly, it is apparent that the present invention is applicable to purposes of use other than a power management IC.

What is claimed is:

1. A method of manufacturing a semiconductor integrated circuit device, comprising:

an N-type well layer formation step of forming a silicon oxide film and a silicon nitride film on an N-type semiconductor substrate, forming an opening through the silicon nitride film present on a region for forming an N-type well layer so as to form a silicon nitride film opening portion, and implanting an N-type impurity comprising phosphorous by an ion implantation;

a P-type well layer formation step of forming a silicon oxide film on the silicon nitride film opening portion and implanting a P-type impurity comprising one of boron and $BF_2$ into a region other than the region for forming the N-type well layer, from which the silicon nitride film is removed, by the ion implantation in a self-aligned manner;

a third N-type low-concentration impurity layer formation step of implanting an N-type impurity comprising arsenic into a region for forming a third N-type low-concentration impurity layer, by the ion implantation;

a well diffusion step of simultaneously forming the N-type well layer, a P-type well layer, and the third N-type low-concentration impurity layer by a thermal treatment;

a second N-type low-concentration impurity layer formation step of forming a silicon oxide film and a silicon nitride film, forming an opening through the silicon nitride film present on a region for forming a second N-type low-concentration impurity region of a high withstanding-voltage NMOS transistor, and implanting an N-type impurity comprising phosphorous by the ion implantation;

a step of forming a silicon oxide film on the region for forming the second N-type low-concentration impurity layer in the silicon nitride film opening portion, to thereby form an insulating film for electric field relaxation between a gate and a drain of the high withstanding-voltage NMOS transistor;

a gate insulating film formation step of forming a gate insulating film of a low withstanding-voltage NMOS transistor, a low withstanding-voltage PMOS transistor, and the high withstanding-voltage NMOS transistor;

a gate electrode formation step of forming a gate electrode on the gate insulating film;

a first N-type low-concentration impurity layer formation step of implanting phosphorus into a region for forming a drain of the low withstanding-voltage NMOS transistor and a region for forming a source of the low withstanding-voltage NMOS transistor;

a P-type low-concentration impurity layer formation step of implanting one of boron and $BF_2$ into a region for forming a drain of the low withstanding-voltage PMOS transistor and a region for forming a source of the low withstanding-voltage PMOS transistor; and a high-concentration drain/source layer formation step of forming an N-type low-concentration impurity layer containing arsenic in each of the region for forming the drain and the region for forming the source of the low withstanding-voltage NMOS transistor and the region for forming the drain and the region for forming the source of the high withstanding-voltage NMOS transistor, and forming a P-type impurity layer containing $BF_2$ in the region for forming the drain of the low withstanding-voltage PMOS transistor and the region for forming the source of the low withstanding-voltage PMOS transistor.

2. A method of manufacturing a semiconductor integrated circuit device, comprising:

an N-type well layer formation step of forming a silicon oxide film and a silicon nitride film on an N-type semiconductor substrate, forming an opening through the silicon nitride film present on a region for forming an N-type well layer so as to form a silicon nitride film opening portion, and implanting an N-type impurity comprising phosphorous by an ion implantation;

a first P-type well layer formation step of forming a silicon oxide film on the silicon nitride film opening portion and implanting a P-type impurity comprising one of boron and $BF_2$ into a region other than the region for forming the N-type well layer, from which the silicon nitride film is removed, by the ion implantation in a self-aligned manner;

a third N-type low-concentration impurity layer formation step of peeling off the silicon nitride film, forming another silicon nitride film, forming an opening through the silicon nitride film present on a region for forming a third N-type low-concentration impurity layer, implanting an N-type impurity comprising arsenic by the ion implantation;

a second P-type well layer formation step of forming a silicon oxide film on the silicon nitride film opening portion, and implanting a P-type impurity comprising one of boron and $BF_2$ into a region other than the region for forming the third N-type low-concentration impurity layer and the region for forming the N-type well layer on the N-type semiconductor substrate, from which the silicon nitride film is removed, by the ion implantation in a self-aligned manner;

a well diffusion step of simultaneously forming an N-type well layer, a first P-type well layer, a second P-type well layer, and the third N-type low-concentration impurity layer by a thermal treatment;

a second N-type low-concentration impurity layer formation step of forming a silicon oxide film and a silicon nitride film, forming an opening through the silicon nitride film present on a region for forming a second N-type low-concentration impurity region of a high withstanding-voltage NMOS transistor, and implanting an N-type impurity comprising phosphorous by the ion implantation;

a step of forming a silicon oxide film on the region for forming the second N-type low-concentration impurity layer in the silicon nitride film opening portion, to thereby form an insulating film for electric field relaxation between a gate and a drain of the high withstanding-voltage NMOS transistor;

a gate insulating film formation step of forming a gate insulating film of a low withstanding-voltage NMOS transistor, a low withstanding-voltage PMOS transistor, and the high withstanding-voltage NMOS transistor;

a gate electrode formation step of forming a gate electrode on the gate insulating film;

a first N-type low-concentration impurity layer formation step of implanting phosphorus into a region for forming a drain of the low withstanding-voltage NMOS transistor and a region for forming a source of the low withstanding-voltage NMOS transistor;

a P-type low-concentration impurity layer formation step of implanting one of boron and $BF_2$ into a region for forming a drain of the low withstanding-voltage PMOS transistor and a region for forming a source of the low withstanding-voltage PMOS transistor; and a high-concentration drain/source layer formation step of forming an N-type low-concentration impurity layer containing arsenic in each of the region for forming the drain and the region for forming the source of the low withstanding-voltage NMOS transistor and the region for forming the drain and the region for forming the source of the high withstanding-voltage NMOS transistor, and forming a P-type impurity layer containing $BF_2$ in the region for forming the drain of the low withstanding-voltage PMOS transistor and the region for forming the source of the low withstanding-voltage PMOS transistor.

3. A method of manufacturing a semiconductor integrated circuit device according to claim 2, wherein:

an impurity dose amount in the N-type well layer formation step is from $3\times10^{12}/cm^2$ to $3\times10^{13}/cm^2$;

an impurity dose amount in the first P-type well layer formation step is from $2\times10^{12}/cm^2$ to $2\times10^{13}/cm^2$;

an impurity dose amount in the second P-type well layer formation step is from $5\times10^{12}/cm^2$ to $2\times10^{13}/cm^2$;

an impurity dose amount in the third N-type low-concentration impurity layer formation step is from $8\times10^{12}/cm^2$ to $7\times10^{13}/cm^2$;

an impurity dose amount in the second N-type low-concentration impurity layer formation step is from $1\times10^{12}/cm^2$ to $7\times10^{13}/cm^2$;

an impurity dose amount in the first N-type low-concentration impurity layer formation step is from $2\times10^{12}/cm^2$ to $2\times10^{14}/cm^2$;

an impurity dose amount in the P-type low-concentration impurity layer formation step is from $2\times10^{12}/cm^2$ to $2\times10^{14}/cm^2$; and a dose amount of the N-type impurity and a dose amount of the P-type impurity in the high-concentration drain/source layer formation step are $2\times10^{15}/cm^2$ or larger.

* * * * *